US007745827B2

(12) United States Patent
Asami

(10) Patent No.: US 7,745,827 B2
(45) Date of Patent: Jun. 29, 2010

(54) MEMORY DEVICE

(75) Inventor: Yoshinobu Asami, Atsugi (JP)

(73) Assignee: Semiconductor Energy Laboratory Co., Ltd., Atsugi-shi, Kanagawa-ken ( * ) Notice: Subject to any disclaimer, the term of this patent is extended or adjusted under 35 U.S.C. 154(b) by 567 days.

(21) Appl. No.: 11/525,950

(22) Filed: Sep. 25, 2006

(65) Prior Publication Data
US 2007/0069266 A1    Mar. 29, 2007

(30) Foreign Application Priority Data
Sep. 29, 2005    (JP)    ............... 2005-285561

(51) Int. Cl.
*H01L 29/04*    (2006.01)
*H01L 29/68*    (2006.01)
*G11C 11/22*    (2006.01)

(52) U.S. Cl. .............................. 257/72; 257/91; 257/93; 257/295; 257/296; 257/751; 257/774; 257/E21.683; 257/E21.664; 257/E27.081; 257/E27.104; 365/145; 438/158; 438/238; 438/398

(58) Field of Classification Search .................. 257/72, 257/91, 93, 295, 296, 751, 774, E21.683, 257/E21.664, E27.081, E27.104; 365/145; 438/158, 238, 398
See application file for complete search history.

(56) References Cited
U.S. PATENT DOCUMENTS

| | | | |
|---|---|---|---|
| 5,850,090 A | 12/1998 | Oashi et al. | |
| 5,994,730 A | 11/1999 | Shrivastava et al. | |
| 6,384,439 B1 | 5/2002 | Walker | |
| 6,465,828 B2 | 10/2002 | Agarwal | |
| 6,555,420 B1 | 4/2003 | Yamazaki | |
| 6,576,948 B2 | 6/2003 | Hofmann et al. | |
| 6,583,490 B2 | 6/2003 | Hagiwara et al. | |
| 6,690,031 B1 | 2/2004 | Ohtani et al. | |
| 6,958,740 B1 | 10/2005 | Nishikawa | |
| 7,113,420 B2 | 9/2006 | Krieger et al. | |
| 7,368,343 B2 | 5/2008 | Yang | |
| 2003/0198077 A1* | 10/2003 | Ueda et al. .................. 365/145 |
| 2005/0098811 A1* | 5/2005 | Ogiwara ..................... 257/295 |
| 2005/0194645 A1 | 9/2005 | Yamaguchi et al. | |
| 2006/0054894 A1* | 3/2006 | Miyake et al. ................ 257/72 |

(Continued)

FOREIGN PATENT DOCUMENTS

JP    08-116109    5/1996

(Continued)

*Primary Examiner*—Dao H Nguyen
(74) *Attorney, Agent, or Firm*—Eric J. Robinson; Robinson Intellectual Property Law Office, P.C.

(57) ABSTRACT

Conventionally, the layer of the insulator between a cathode and an anode is formed by a droplet discharge method, vapor deposition, or the like separately from an interlayer insulating film formed over a thin film transistor, which creates problems of increase in cost and the number of manufacturing steps. A memory device of the present invention includes a first conductive film; an insulating film formed over the first conductive film; and a second conductive film formed over the insulating film, and an opening and a contact hole which are formed in the insulating film. Further, the insulating film exists between the first conductive film and the second conductive film formed in the opening, and the first conductive film and the second conductive film are electrically connected in the contact hole.

21 Claims, 14 Drawing Sheets

U.S. PATENT DOCUMENTS

2006/0175648 A1    8/2006    Asami

FOREIGN PATENT DOCUMENTS

| | | |
|---|---|---|
| JP | 11-311805 | 11/1999 |
| JP | 2000-150906 | 5/2000 |
| JP | 2005-294814 | 10/2005 |
| JP | 2006-113564 | 4/2006 |
| WO | WO 2006/085633 | 8/2006 |

* cited by examiner

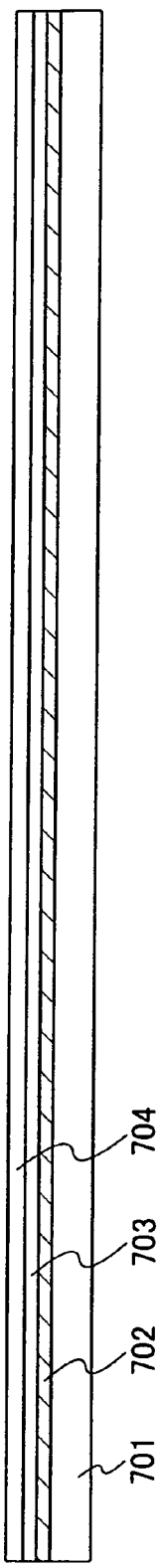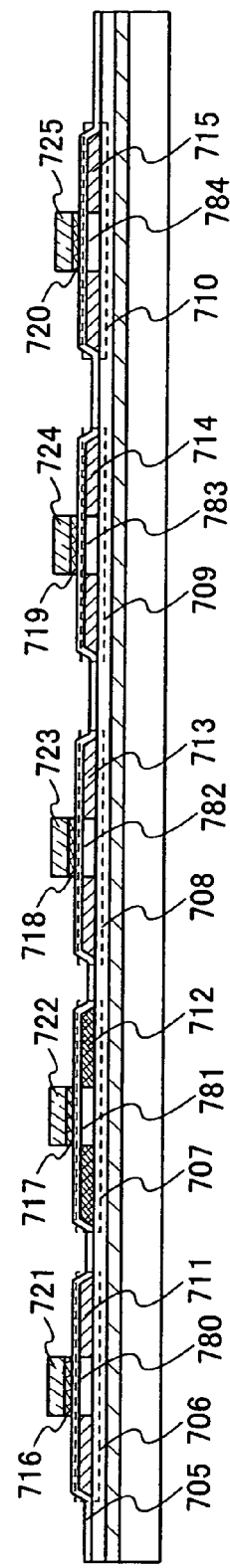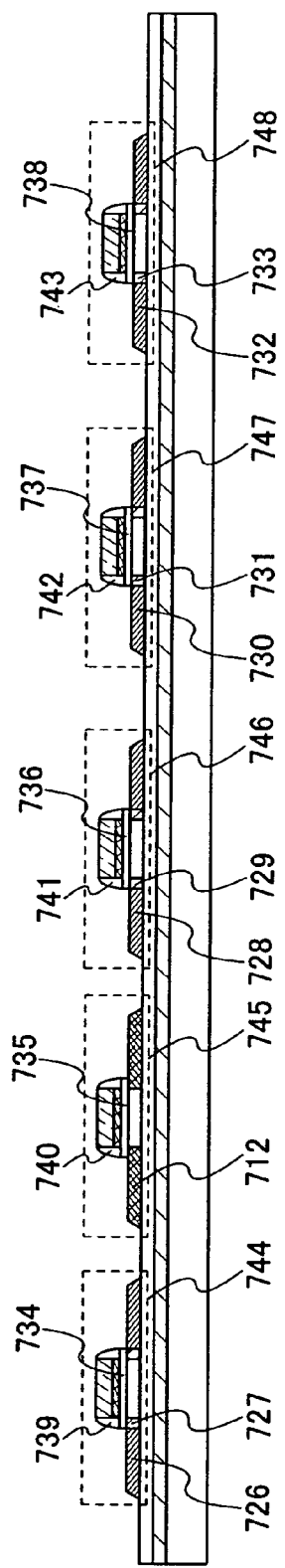

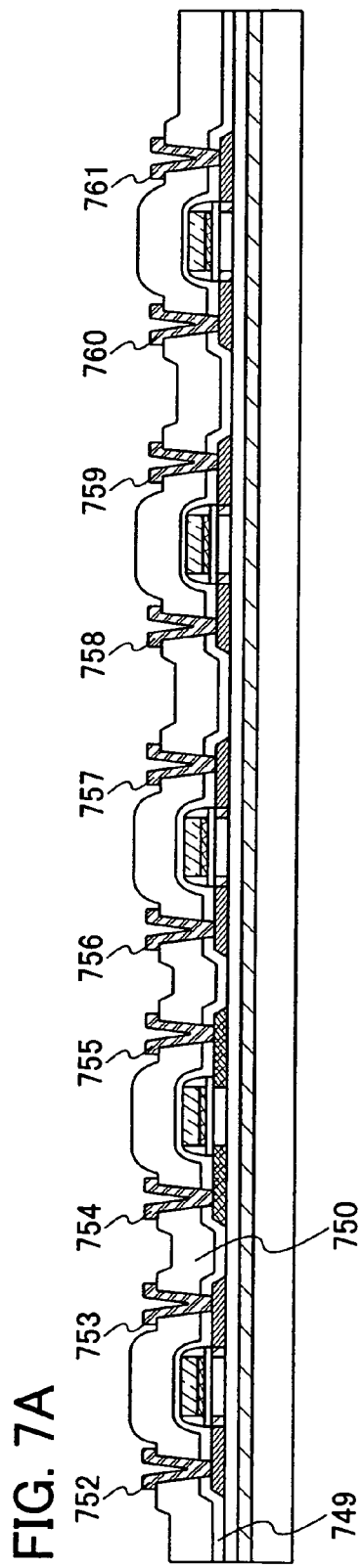
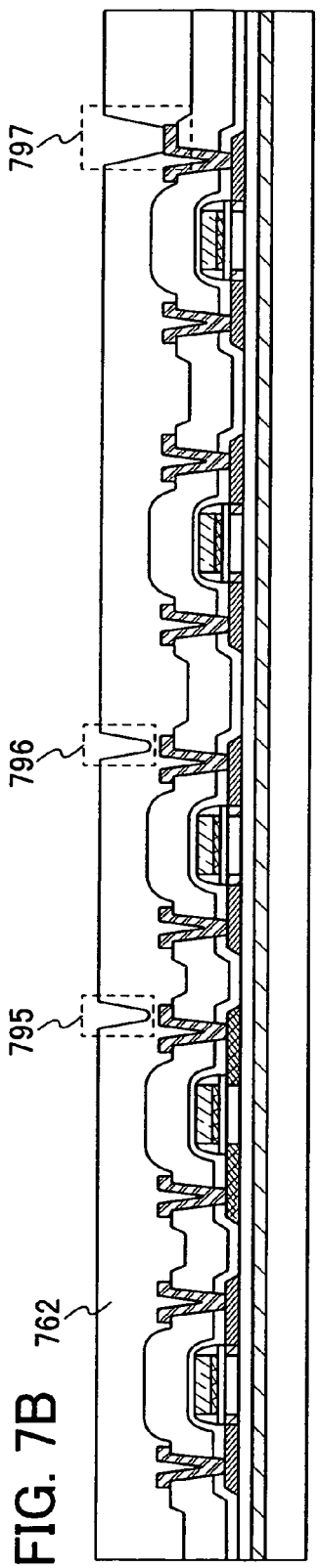
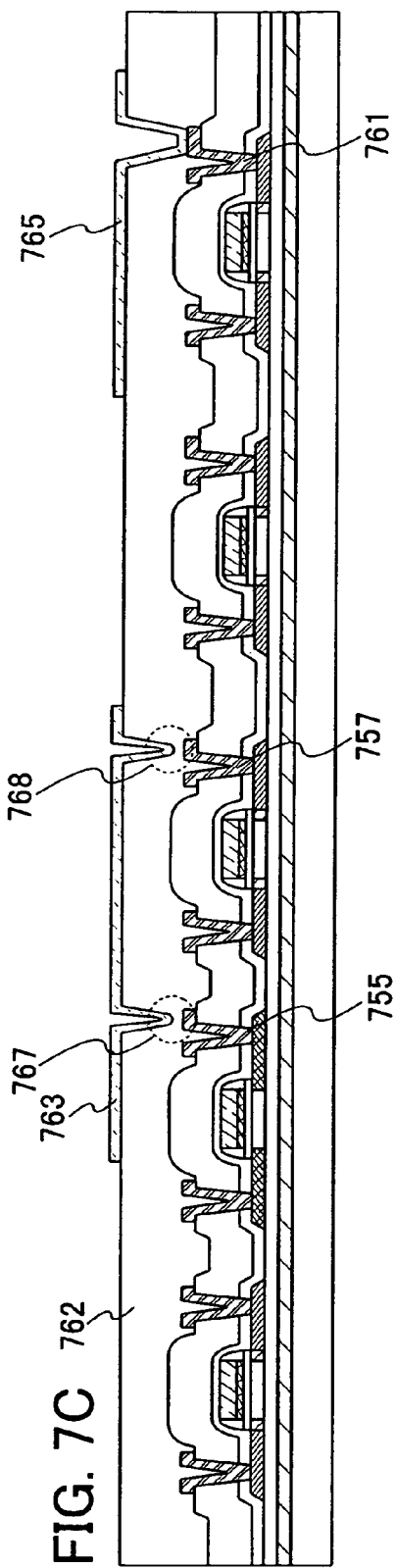
FIG. 7A
FIG. 7B
FIG. 7C

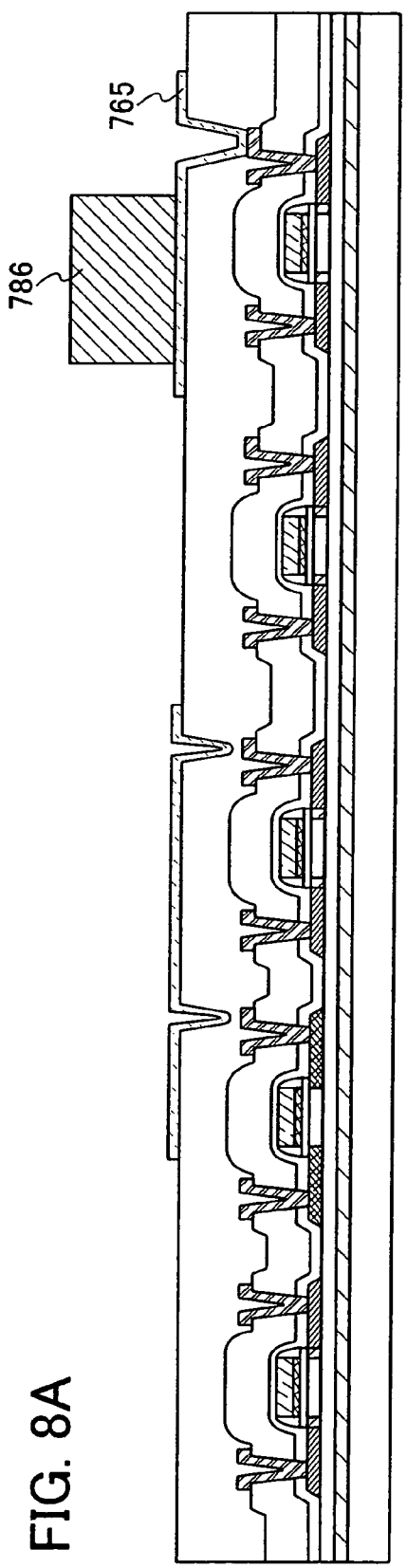
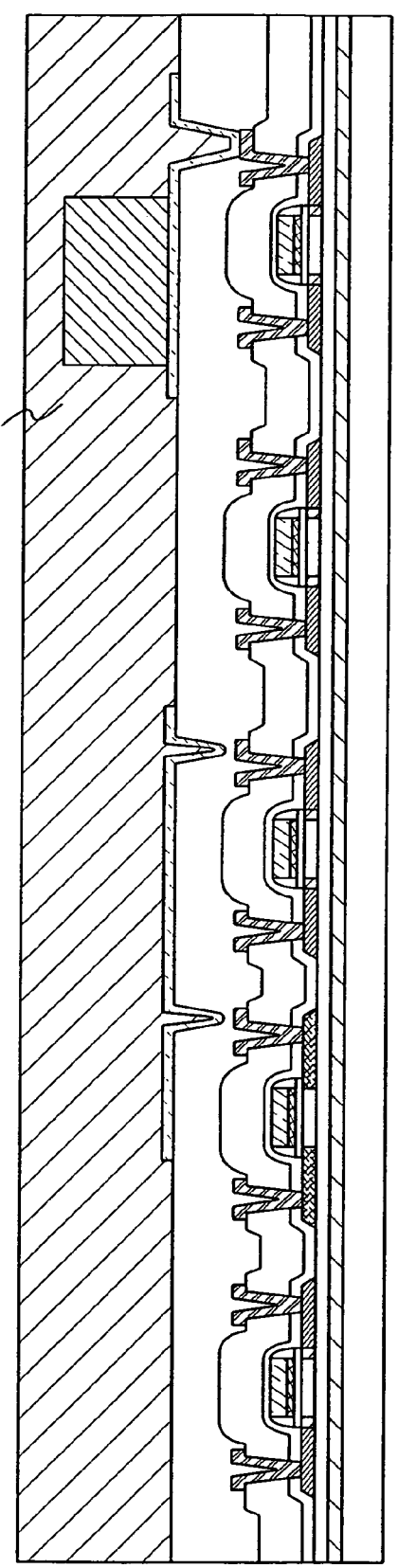
FIG. 8A
FIG. 8B

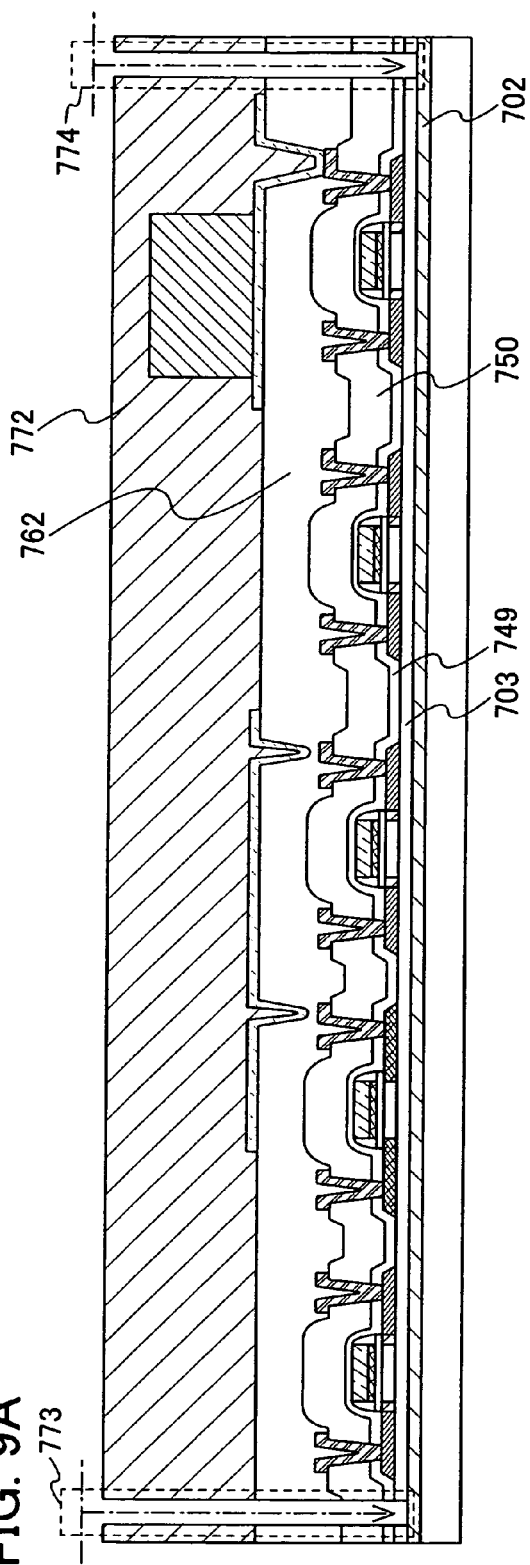
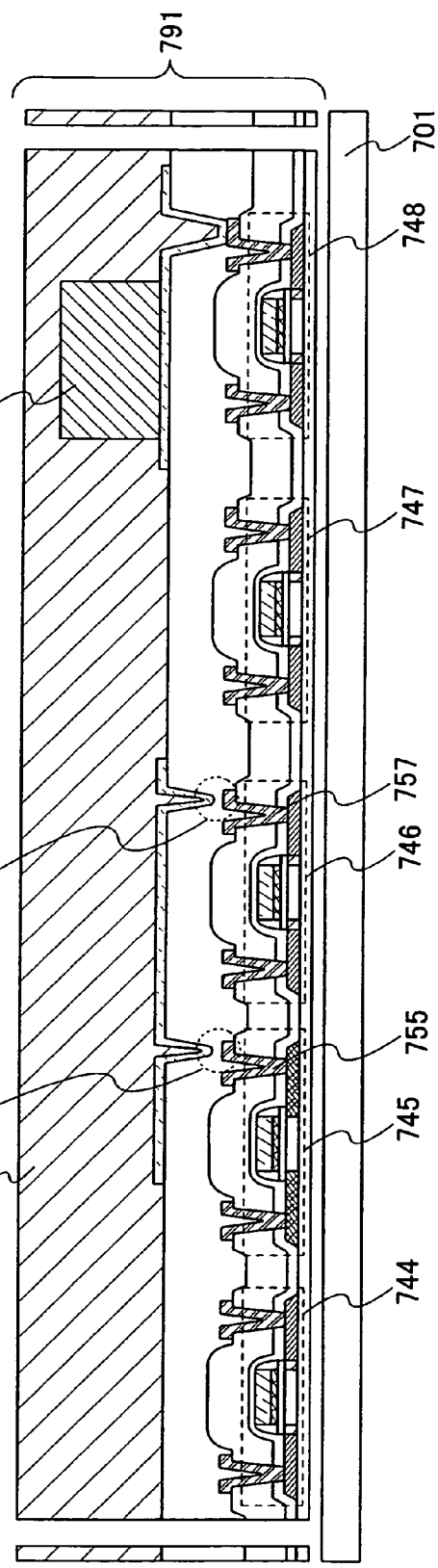
FIG. 9A
FIG. 9B

MEMORY DEVICE

BACKGROUND OF THE INVENTION

1. Field of the Invention

The present invention relates to a memory device having a nonvolatile memory, such as a write once memory device.

2. Description of the Related Art

In modern society, where many electronic devices are used, various data are generated and used; therefore, memory devices are required to store the data. Various memory devices produced and used today have different advantages and disadvantages, and are used properly depending on the data to be stored and used.

For example, a volatile memory that loses its memory content when the power is turned off includes a DRAM and an SRAM. The applications of volatile memories are significantly limited because of the volatility; however, each of them is used as a main memory device or a cash memory of a computer taking advantage of a short access time. Since a DRAM has small memory cells, a large-capacity DRAM can be produced easily. However, it is controlled in a complex manner and consumes much power. An SRAM includes a memory cell formed from a CMOS transistor and is easily manufactured and controlled; however, it is difficult to obtain a large-capacity SRAM since one memory cell needs six transistors.

A nonvolatile memory that holds its memory content even after the power is turned off includes: a rewritable memory into which data can be rewritten many times; a write-once memory into which data can be written by a user only once; and a mask ROM of which data content determined in the manufacturing of the memory cannot be rewritten. As the rewritable memory, there are an EPROM, a flash memory, a ferroelectric memory, and the like. The EPROM allows an easy writing of data and unit cost per bit is relatively low; however, a program device and an eraser dedicated to writing and erasing are required. The flash memory and the ferroelectric memory can be rewritten on a substrate used, have a short access time, and consume less power; however, steps for manufacturing a floating gate and a ferroelectric layer are required. Thus, the unit cost per bit is high.

Each memory cell of a write-once memory includes a fuse, an antifuse, a cross pointer diode, an OLED (Organic Light Emitting Diode), a bistable liquid crystal element, and other devices whose states are changed by heat or light. Further, in recent years, memory elements using organic materials are actively developed (for example, Reference 1: Japanese Patent Application Publication No. 8-116109).

Further, in the case of using a structure in which an insulator is sandwiched between conductive films serving as a cathode and an anode, which is provided over a thin film transistor for a memory cell of a write once memory, the layer of the insulator sandwiched between the cathode and the anode is formed by a droplet discharge method, vapor deposition, or the like separately from an interlayer insulating film formed over the thin film transistor, which creates problems of increase in cost and the number of manufacturing steps.

SUMMARY OF THE INVENTION

In view of the above problems, it is an object of the present invention to provide a write once memory device which can be manufactured in fewer steps at lower cost and a semiconductor device using the memory device.

A memory device of the present invention includes a first conductive film; an insulating film formed over the first conductive film; and a second conductive film formed over the insulating film and an opening formed in the insulating film. The insulating film exists between the first conductive film and the second conductive film in the opening.

A memory device of the present invention includes a first conductive film; an insulating film formed over the first conductive film; and a second conductive film formed over the insulating film, and an opening and a contact hole which are formed in the insulating film. The insulating film exists between the first conductive film and the second conductive film in the opening, and the first conductive film and the second conductive film are electrically connected in the contact hole.

A memory device of the present invention includes a thin film transistor formed over a substrate; a first insulating film formed over the thin film transistor; a first conductive film formed over the first insulating film; a second insulating film formed over the first conductive film; and a second conductive film formed over the second insulating film and an opening formed in the second insulating film. The second insulating film exists between the first conductive film and the second conductive film in the opening.

A memory device of the present invention includes a thin film transistor formed over a substrate; a first insulating film formed over the thin film transistor; a first conductive film formed over the first insulating film; a second insulating film formed over the first conductive film; and a second conductive film formed over the second insulating film, and an opening and a contact hole which are formed in the second insulating film. The second insulating film exists between the first conductive film and the second conductive film in the opening, and the first conductive film and the second conductive film are electrically connected in the contact hole.

In a memory device of the present invention, the first conductive film and the second conductive film are as adjacent to each other as to be shorted at the bottom of the opening by dielectric breakdown. Note that, as to a memory device of the invention, a memory element portion is formed from an insulating film, the first conductive film, and the second conductive film at the bottom of the opening; and data can be stored due to short circuit between the first conductive film and the second conductive film caused by breaking the insulating film.

A memory device of the present invention includes a base insulating film formed over a substrate; a semiconductor film having at least a first impurity region and a second impurity region formed over the base insulating film; a gate insulating film formed over the semiconductor film; a gate electrode formed over the gate insulating film; an insulating film formed over the gate electrode; a first conductive film formed over the insulating film and an opening formed in the insulating film; and a second conductive film formed over the insulating film and a contact hole formed in the insulating film. The insulating film exists between the first impurity region and the first conductive film in the opening, and the second impurity region and the second conductive film are electrically connected in the contact hole.

In a memory device of the invention, the first impurity region and the first conductive film are as adjacent to each other as to be shorted at the bottom of the opening by dielectric breakdown. Note that, as to a memory device of the invention, a memory element portion is formed from an insulating film, the first impurity region, and the first conductive film at the bottom of the opening; and data can be stored due to short circuit between the first impurity region and the second conductive film caused by breaking the insulating film.

In the present invention, a part of an interlayer insulating film is used as an insulating film sandwiched between two electrodes of a memory device; thus, the number of steps can be reduced and cost can be reduced.

BRIEF DESCRIPTION OF THE DRAWINGS

In the accompanying drawings:

FIGS. 6A to 6C are figures showing steps for manufacturing a semiconductor device of the invention;

FIGS. 7A to 7C are figures showing steps for manufacturing a semiconductor device of the invention;

FIGS. 8A and 8B are figures showing steps for manufacturing a semiconductor device of the invention;

FIGS. 9A and 9B are figures showing steps for manufacturing a semiconductor device of the invention;

DETAILED DESCRIPTION OF THE INVENTION

Figure 1A:
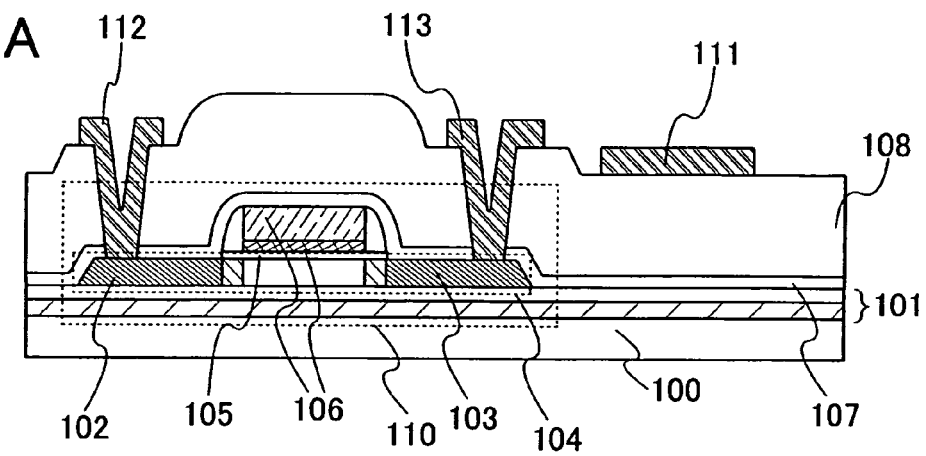
FIGS. 1A to 1C are figures showing steps for manufacturing a memory device of the invention.

Preferred Embodiment Modes and Embodiment of the present invention will be described with reference to the drawings. It is easily understood by those skilled in the art that the invention is not limited by the following modes and various changes may be made in forms and details without departing from the spirit and scope of the invention. Therefore, the invention should not be limited to the descriptions of Embodiment Modes and Embodiments below. The same reference numerals are commonly given to the same components or components having the same function in the structure of the invention, and the explanation will not be repeated. In addition, Embodiment Modes 1 to 7 described below can be freely combined with each other.

Embodiment Mode 1

In this embodiment mode, a memory device using a part of an insulating film as a memory will be described.

First, a thin film transistor (TFT) 110 is formed over a substrate 100 (FIG. 1A). The thin film transistor 110 includes at least a semiconductor film 104 having impurity regions 102 and 103 provided over the substrate 100 with a base insulating film 101 therebetween, a gate electrode 106 provided over the semiconductor film 104 with a gate insulating film 105 therebetween, an insulating film 107 having a thickness of 50 nm to 200 nm provided so as to cover the gate electrode 106. Note that the mode of a thin film transistor is not limited to the one shown in this embodiment mode.

Subsequently, an insulating film 108 is formed to a thickness of 600 nm to 1500 nm as a single layer or a stack over the insulating film 107 (FIG. 1A). The insulating film 108 formed over the insulating film 107 is formed as a single layer or a stack using an inorganic material such as an oxide of silicon or a nitride of silicon, an organic material such as polyimide, polyamide, benzocyclobutene, acrylic, epoxy or siloxane, or the like, by plasma CVD, an SOG method, a droplet discharge method, or the like.

It is to be noted that before the insulating films 107 and 108 are formed, after the insulating film 107 is formed, or after at least one of the films forming the insulating film 108 is formed, heat treatment for recovering the crystallinity of the semiconductor film 104, for activating the impurity element which added into the semiconductor film 104, or for hydrogenating the semiconductor film 104 is preferably performed. For the heat treatment, a thermal annealing method, a laser annealing method, an RTA method, or the like is preferably used.

Next, the insulating film 108 is etched to form an opening in the insulating film 108. Photolithography or the like can be used for the etching. Then, a conductive film (not shown) is formed over the opening and the insulating film 108 and the conductive film is etched to form conductive films (wirings) 111 to 113 to film thicknesses of 500 nm to 900 nm (FIG. 1A). Here, the conductive films (wirings) 112 and 113 are electrically connected to the impurity regions 102 and 103, respectively.

The conductive films (wirings) 111 to 113 are formed as a single layer or a stack using an element selected from titanium (Ti), aluminum (Al), and neodymium (Nd), or an alloy material or a compound material containing the above-described element as its main component by plasma CVD or sputtering. An alloy material containing aluminum as its main component corresponds to a material containing nickel whose main component is aluminum or an alloy material containing nickel and one or both of carbon and silicon whose main component is aluminum, for example. Each of the conductive films (wirings) 111 to 113 preferably employs, for example, a stack structure of a barrier film, an aluminum-silicon (Al—Si) film, and a barrier film, or a stack structure of a barrier film, an aluminum-silicon (Al—Si) film, a titanium nitride (TiN) film and a barrier film.

It is to be noted that the barrier film corresponds to a thin film formed by using titanium, a nitride of titanium, molybdenum, or a nitride of molybdenum. Aluminum and aluminum-silicon which have low resistance and are inexpensive are optimal materials for forming the conductive films (wirings) 111 to 113. In addition, generation of a hillock of aluminum or aluminum-silicon can be prevented when the barrier films are provided as an upper layer and a lower layer of the conductive films 113 to 113. Furthermore, when the barrier film is formed of titanium that is a highly-reducible element, even if a thin natural oxide film is formed over the crystalline semiconductor film, the natural oxide film is reduced so that preferable contact with the crystalline semiconductor film can be obtained.

Figure 1B:
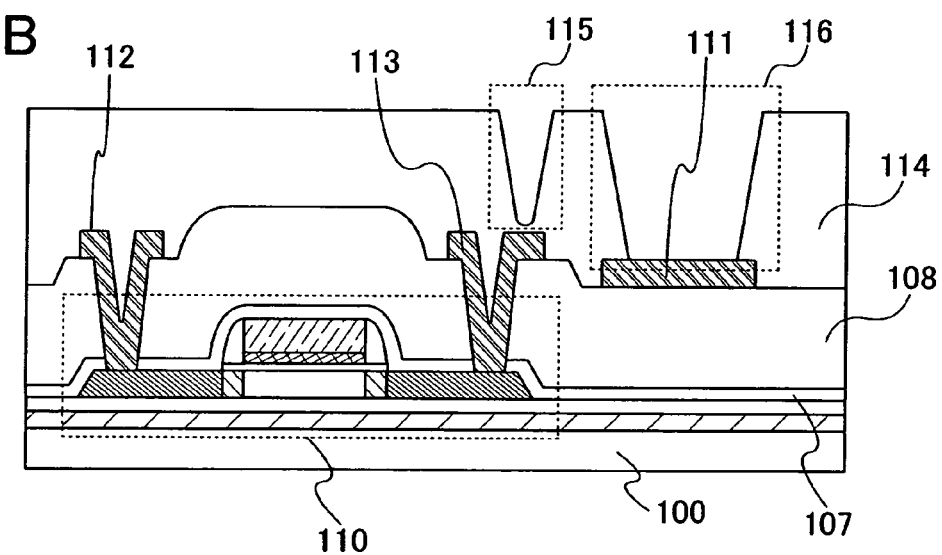

Next, a single layer or a stack of an insulating film 114 is formed to a thickness of 800 nm to 1500 nm as to cover the insulating film 108 and the conductive films (wirings) 111 to 113 (FIG. 1B). The insulating film 114 is formed as a single layer or a stack using an inorganic material or an organic material by an SOG method, a droplet discharging method, or the like. The insulating film 114 is preferably formed to a thickness of 0.75 μm to 3 μm.

Subsequently, the insulating film 114 is etched by photolithography or the like, so that openings 115 and 116 having different depths are formed. Here, the opening 115 is formed to make the insulating film be partially thinner so as not to expose the conductive film (wiring) 113 at the bottom. In other words, the opening 115 is a depression (reentrant), which is formed so that the insulating film 114 remains between the conductive film (wiring) 113 and a conductive film 117 to be formed later. Further, the opening 116 is a contact hole for exposing the conductive film (wiring) 111 as shown in FIG. 1B.

The openings 115 and 116 having different depths can be formed by opening each portion separately in two steps. For example, after only the opening 115 is formed by etching using photolithography, only the opening 116 is formed by etching using photolithography again; thus, the openings 115 and 116 having different depths can be formed separately. Note that the opening 116 may be formed before forming the opening 115.

Figure 1C:
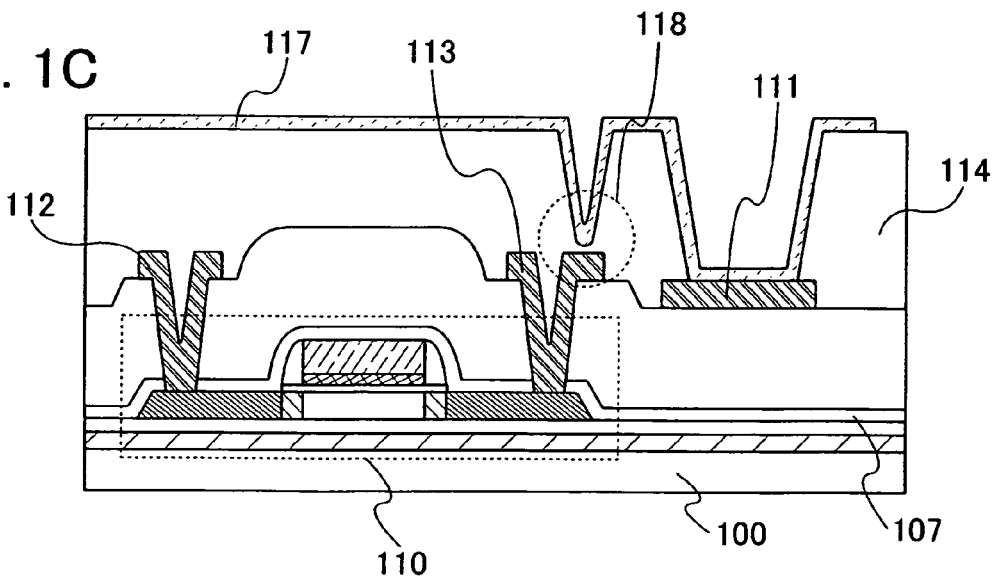

Then, a conductive film is formed on the contact hole 115, 116. The conductive film is formed by a plasma CVD method, a sputtering method, or the like, by using a conductive material. Then, the conductive film is etched to form a conductive film 117 (FIG. 1C). The conductive film 117 is preferably formed to a thickness of 50 nm to 400 nm. It is to be noted that the conductive film 117 becomes one of a pair of conductive films forming a memory element portion. The conductive film 117 is preferably formed as a single layer or a stack using titanium, or an alloy material or a compound material containing titanium as its main component. In addition, in the photolithography process for forming the conductive film 117, it is preferable to perform wet etching in order to prevent damage to the thin film transistor 110 provided below the conductive film 117.

Through the above steps, a memory element portion 118 formed from a stack of the conductive film (wiring) 113, the insulating film 114, and the conductive film 117 is completed. Accordingly, the memory element portion 118 is formed from the insulating film 114, and the conductive film (wiring) 113 and the conductive film 117 which overlap with each other with the insulating film 114 therebetween. In this embodiment mode, the conductive film (wiring) 113 and the conductive film 117 are adjacent to each other at the bottom of the opening 115, so that they may be shorted by dielectric breakdown. Note that the thin film transistor 110 is one for selecting some of a plurality of memory devices, and is not limited to the structure shown as long as it has a switching function.

In this embodiment mode, an insulating film sandwiched between conductive films used, for example, as a cathode and an anode, of a memory device is not required to be formed separately; thus, the number of manufacturing steps is reduced, and cost can be reduced.

Embodiment Mode 2

A method for manufacturing the insulating film 114, a part of which is thinner, which is different from the manner shown in Embodiment Mode 1 will be described.

Figure 2A:
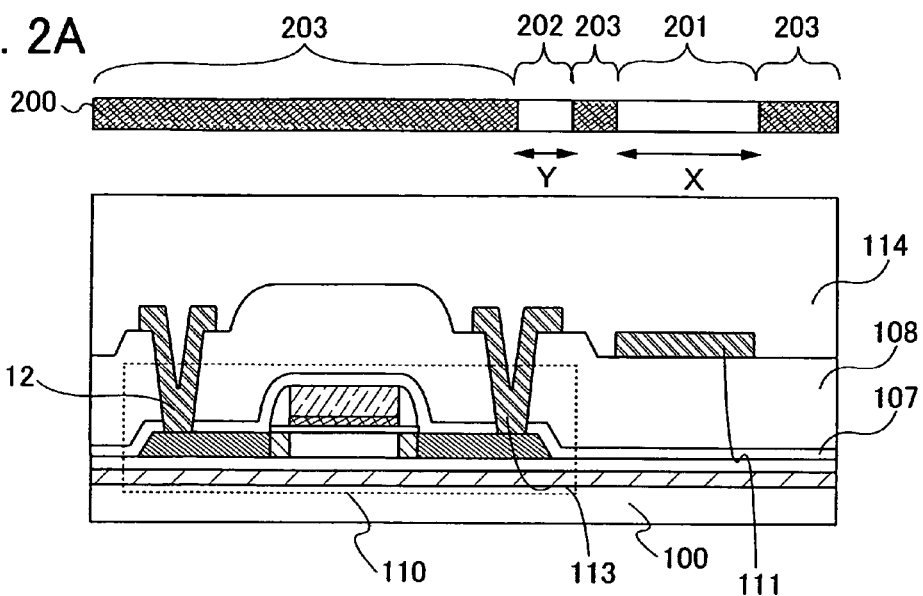
FIGS. 2A to 2C are figures showing steps for manufacturing a memory device of the invention.

As shown in FIG. 2A, after forming conductive films (wirings) 111 to 113, an insulating film 114 is formed as in Embodiment Mode 1. In this embodiment mode, a photosensitive material is used for the insulating film 114. The insulating film 114 is exposed using a photomask 200. The photomask 200 is provided with a first light transmitting portion 201, a second light transmitting portion 202, and a light shielding portion 203. In this embodiment mode, the diameter (or area) Y of the second light transmitting portion 202 is smaller than the diameter (or area) X of the first light transmitting portion 201 provided on the photomask 200. The insulating film 114 is etched faster as the diameter (or area) of the light transmitting portion provided on the photomask is larger. Therefore, the part of the insulating film 114 which is exposed through the second light transmitting portion 202 can be etched more shallowly compared to the part of the insulating film 114 which is exposed through the first light transmitting portion 201. By arbitrarily changing the diameters (or areas) X and Y, the etching rate of the insulating film 114 can be controlled, and openings having different depths can be formed in the insulating film 114. The first light transmitting portion 201 and the second light transmitting portion 202 transmit light and they may be replaced by openings. The light shielding portion 203 hardly transmits light.

Figure 2B:
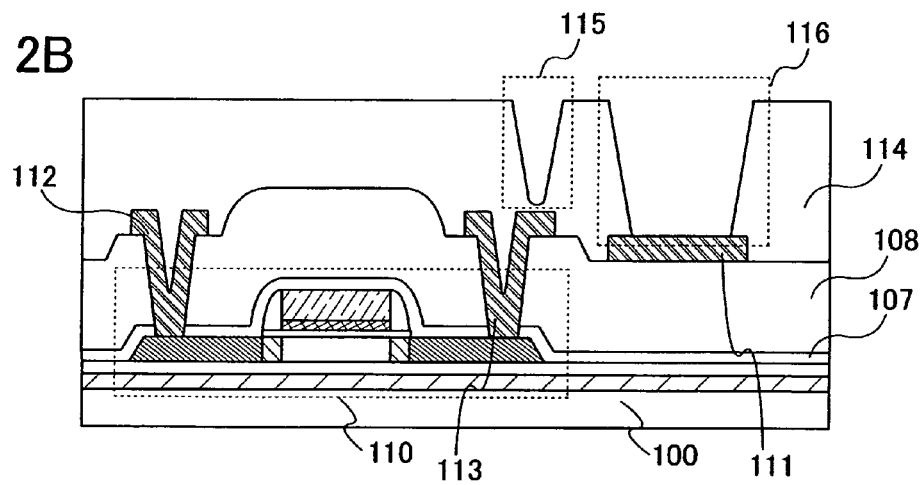

Next, the insulating film 114 is developed (FIG. 2B). The part of the insulating film 114 which overlaps with the light shielding portion 203 is hardly etched. Further, the part of the insulating film 114 which is exposed at the first light transmitting portion 201 is etched a lot, an opening 116 through which a surface of the conductive film (wiring) 111 is exposed is formed. Further, the etching rate of the part of insulating film 114 which is exposed through the second light transmitting portion 202 is slower than the part thereof which is exposed through the first light transmitting portion 201. Thus, an opening 115 which is shallower than the opening 116 is formed in the insulating film 114. Accordingly, the opening 115 under which a part of the insulating film 114 remains thinly is formed. Consequently, the insulating film 114, a part of which is thinner can be obtained.

Figure 2C:
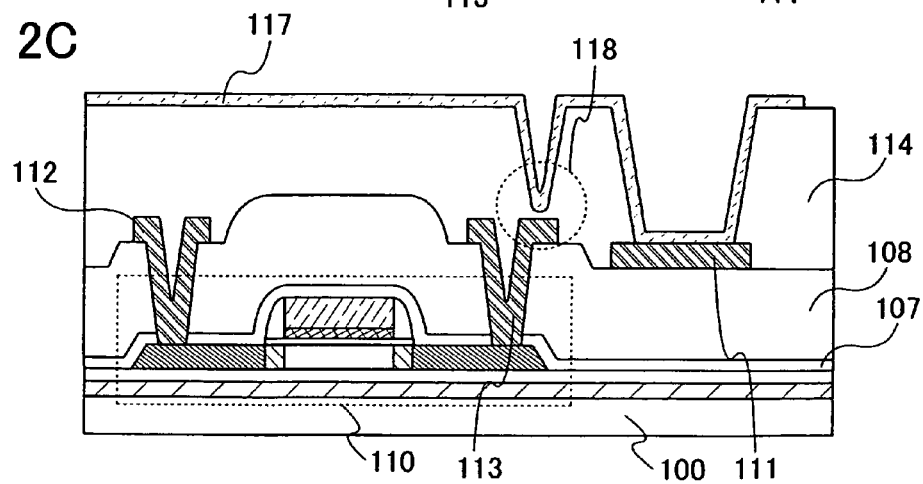

Then, as shown in FIG. 2C, a conductive film 117 is formed at the openings 115 and 116. Through the above steps, a memory element portion 118 formed from a laminate of the conductive film (wiring) 113, the insulating film 114, and the conductive film 117 is completed.

In this embodiment mode, the etching rate of the insulating film 114 is controlled by changing the diameter (or area) of each light transmitting portion of the photomask, so that a plurality of openings having different depths can be formed by a one-time etching process.

Embodiment Mode 3

A manufacturing method of an insulating film 114, a part of which is thinner, which is different from the methods shown in Embodiment Mode 1 and Embodiment Mode 2 will be described with reference to FIGS. 3A to 3C. Note that in FIGS. 3A to 3C, the same portions as those in FIGS. 1A to 1C are denoted by the same reference numerals and description thereof is omitted.

Figure 3A:
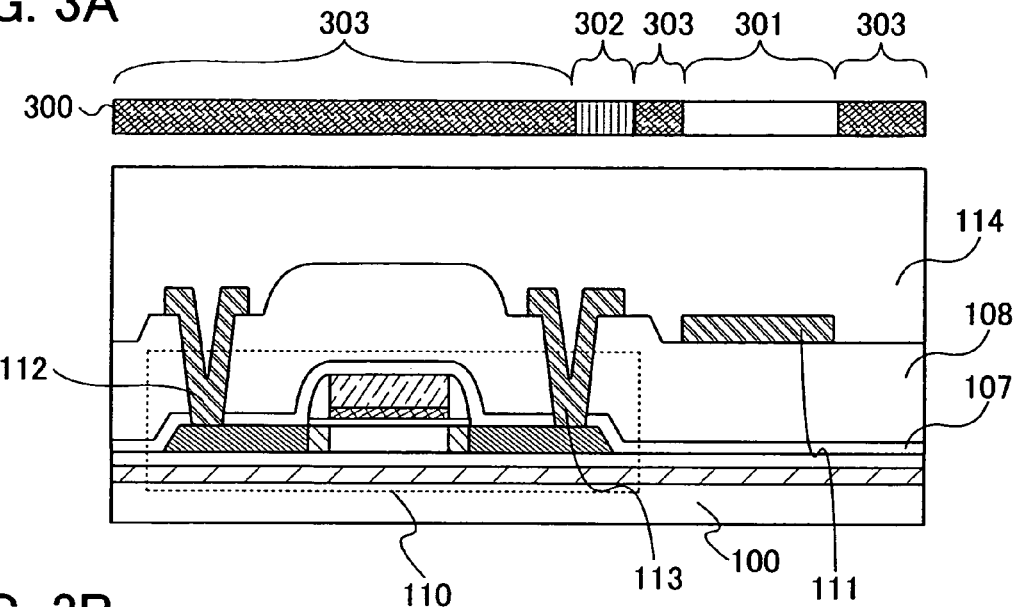
FIGS. 3A to 3C are figures showing steps for manufacturing a memory device of the invention.

In FIG. 3A, as with Embodiment Mode 1, after forming conductive films (wirings) 111 to 113, an insulating film 114 is formed. In this embodiment mode, a photosensitive material is used for the insulating film 114. The insulating film 114 is exposed using a photomask 300. The photomask 300 is provided with a first light transmitting portion 301, a second light transmitting portion 302, and a light shielding portion 303. The first light transmitting portion 301 may be an opening. The intensity of light transmitting through the photomask 300 is lower at the second light transmitting portion 302 than at the first light transmitting portion 301. The light shielding portion 303 hardly transmits light. In this embodiment mode, such a half-tone mask is used as the photomask 300.

Figure 3B:
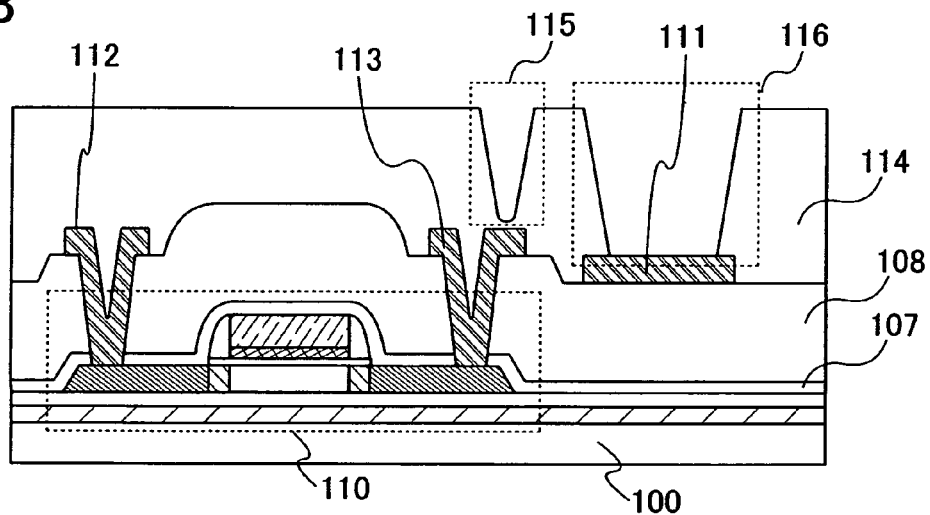

Next, the insulating film 114 is developed (FIG. 3B). The part of the insulating film 114 which overlaps with the light shielding portion 303 is hardly etched. The part of the insulating film 114 which is exposed through the first light transmitting portion 301 is etched a lot. In this manner, an opening 116 in which a surface of the conductive film (wiring) 111 is exposed is formed. The part of the insulating film 114 which is exposed through second light transmitting portion 302 is etched more shallowly than the part thereof which is exposed through the first light transmitting portion 301. Thus, an opening 115 under which a part of the insulating film 114 remains, which is shallower than the opening 116 is formed. In this manner, the insulating film 114, a part of which is thinner is obtained.

Figure 3C:
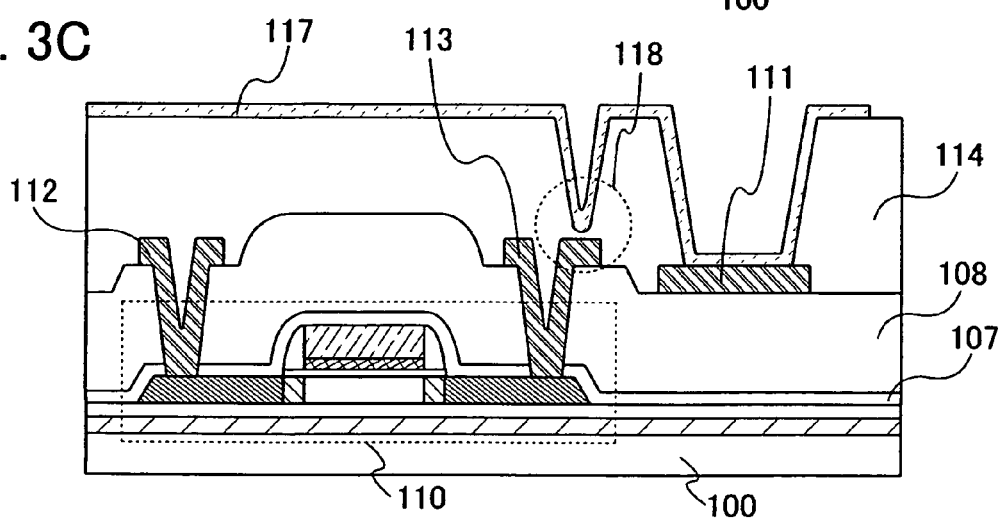

Next, as shown in FIG. 3C, a conductive film 117 is formed at the openings 115 and 116. Through the above steps, a memory element portion 118 formed from a laminate of the conductive film (wiring) 113, the insulating film 114, and the conductive film 117 is completed.

Using the method of this embodiment mode, a plurality of openings having different depths can be formed by a one-time etching process.

Embodiment Mode 4

Figure 4A:
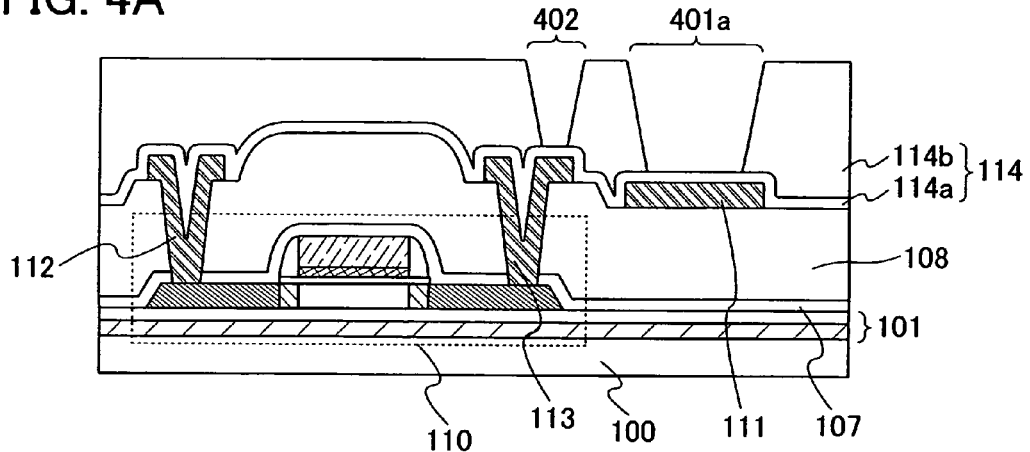
FIGS. 4A to 4C are figures showing steps for manufacturing a memory device of the invention.
Figure 4B:
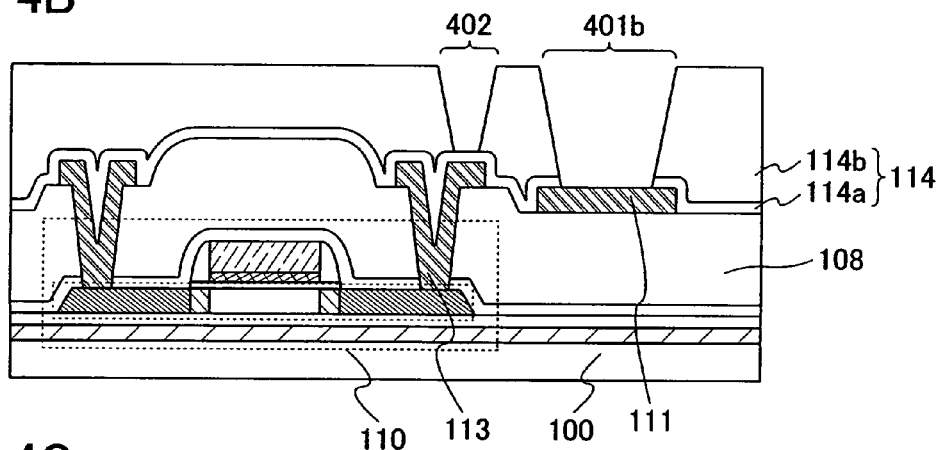
Figure 4C:
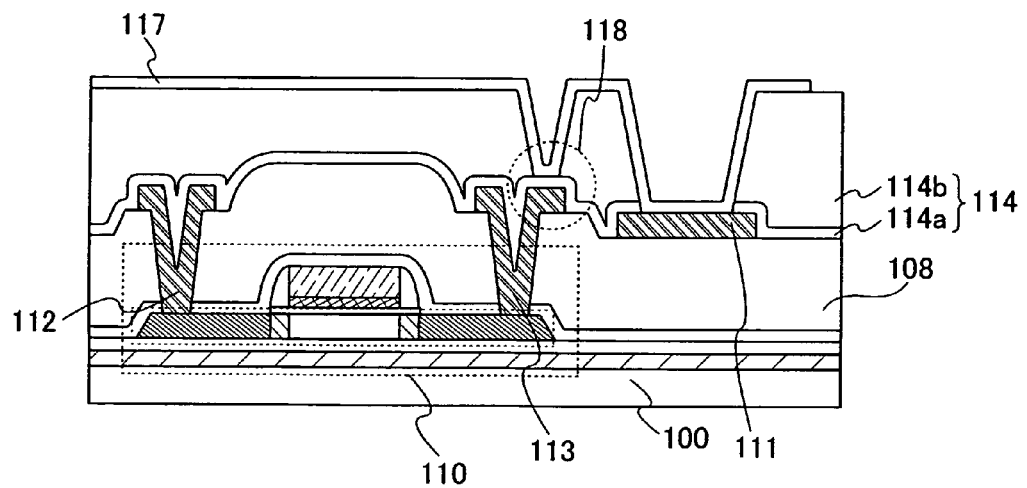

A method for manufacturing an insulating film 114, a part of which is thinner, which is different from the structures shown in Embodiment Mode 1 to Embodiment Mode 3 will be described with reference to FIGS. 4A to 4C. In FIGS. 4A to 4C, the same portions as those in FIGS. 1A to 1C are denoted by the same reference numerals and description thereof is omitted.

In FIG. 4A, as with Embodiment Mode 1, after forming conductive films (wirings) 111 to 113, an insulating film 114a is formed. An insulating film 114b is formed over the insulating film 114a. A single layer or a stack of inorganic insulating films or organic insulating films can be used for the insulating films 114a and 114b. Further, siloxane having a skeleton of a silicon (Si)-oxygen (O) bond can be used. An organic group containing at least hydrogen (for example, an alkyl group or aromatic carbon hydride) can be used for a substituent of siloxane. As the substituent, a fluoro group may be used as well. Alternatively, a fluoro group and an organic group containing at least hydrogen may also be used.

Next, the insulating film 114b is etched to form a first opening 401a and a second opening 402.

The insulating film 114a is etched in the first opening 401a to form a third opening 401b (FIG. 4B). In this manner, the third opening 401b in which a surface of the conductive film (wiring) 111 is exposed and a second opening 402 in which a surface of the insulating film 114a is exposed can be obtained. The insulating films 114a and 114b correspond to the insulating film 114 described in Embodiment Mode 1. In this manner, the insulating film 114, a part of which is thinner can be obtained.

Next, as shown in FIG. 4C, a conductive film 117 is formed. Through the above steps, a memory element portion 118 formed from a laminate of the conductive film (wiring) 113, the insulating film 114, and the conductive film 117 is completed.

Embodiment Mode 5

Figure 5A:
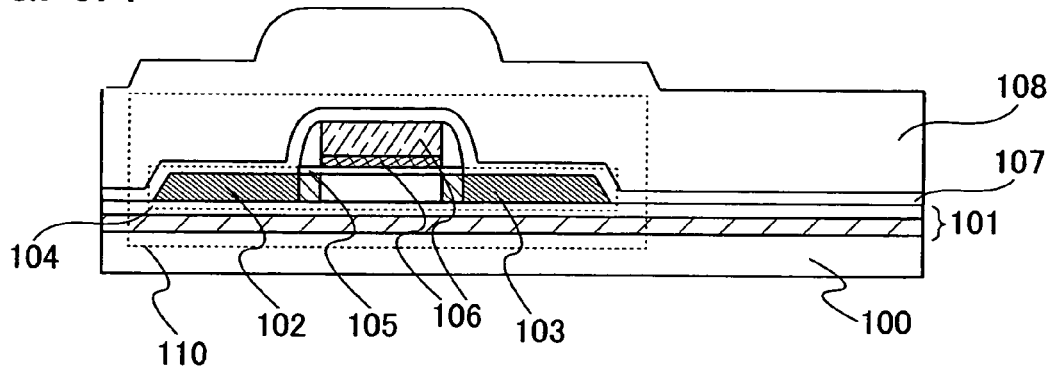
FIGS. 5A to 5C are figures showing steps for manufacturing a memory device of the invention.
Figure 5B:
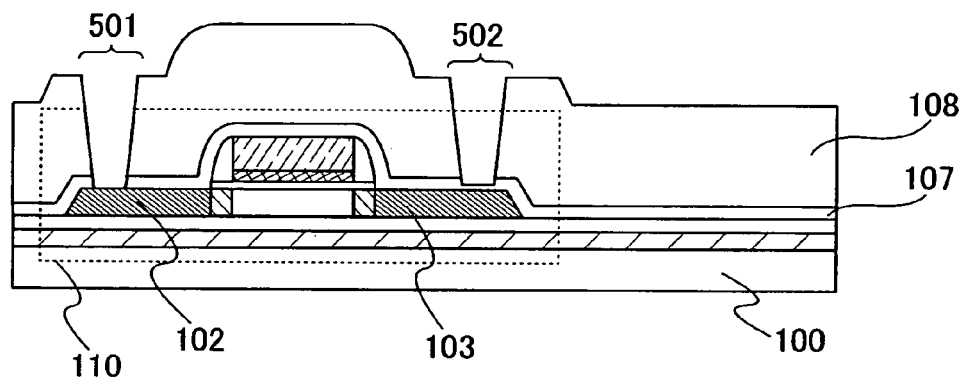
Figure 5C:
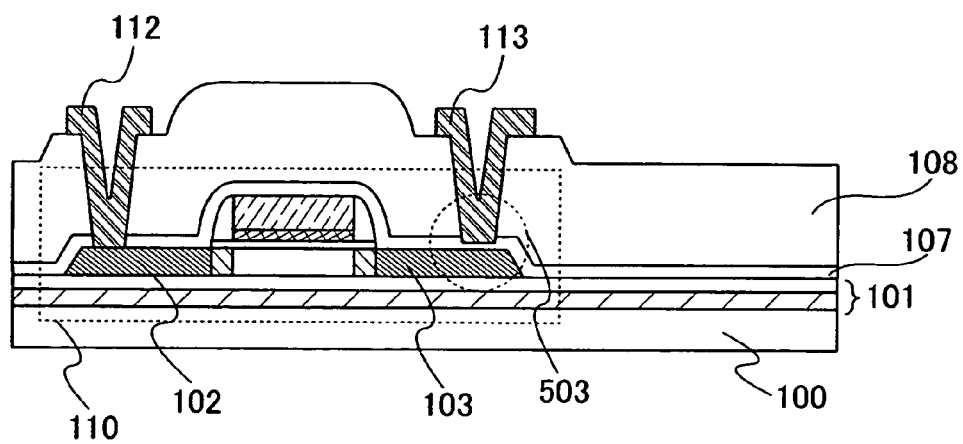

In this embodiment mode, a memory device having a structure different from one shown in Embodiment Mode 1 will be shown with reference to FIGS. 5A to 5C. Specifically, a memory device in which a source wiring or a drain wiring is used as a part of an electrode of a memory will be described. In FIGS. 5A to 5C, the same portions as those in FIGS. 1A to 1C are denoted by the same reference numerals and description thereof is omitted.

First, a thin film transistor 110 is formed over a substrate 100 (FIG. 5A). The thin film transistor 110 includes at least a semiconductor film 104 having impurity regions 102 and 103 formed over the substrate 100 with base insulating films 101 therebetween and a gate electrode 106 formed over the semiconductor film 104 with a gate insulating film 105 therebetween, and an insulating film 107 provided to cover the gate electrode 106. The insulating film 107 is formed as a single layer or a laminate. Note that the mode of the thin film transistor is not limited to the mode shown in this embodiment mode. Next, an insulating film 108 is formed as a single layer or a laminate over the insulating film 107 (FIG. 5A).

Then, the insulating films 107 and 108 are etched to form openings 501 and 502 in the insulating film 108 (FIG. 5B). In this embodiment mode, the opening 502 is formed so as not to expose the impurity region 103 at the bottom, so that a part of the insulating film 107 is thinner as shown in FIG. 5B. In other words, the opening 502 is formed so that the insulating film 107 remains under the opening 502 between the impurity region 103 and the conductive film (wiring) 113 to be formed in a later step. Further, the opening 501 is formed to expose the impurity region 102 as shown in FIG. 5B. The openings 501 and 502 having different depths may be formed by any one of the methods shown in Embodiment Modes 1 to 4.

Next, a conductive film (not shown) is formed over the openings 501 and 502 and the insulating film 108, and the conductive film is etched to form conductive films (wirings) 112 and 113 which serve as a source wiring or a drain wiring (FIG. 5C). In this embodiment mode, the conductive film (wiring) 112 and the impurity region 102 are electrically connected.

Through the above steps, a memory element portion 503 formed from a laminate of the conductive film (wiring) 113, the insulating film 107, and the impurity region 103 is completed. The conductive film (wiring) 113 and the impurity region 103 overlap with each other with the insulating film 107 therebetween. In this embodiment mode, the conductive film (wiring) 113 and the impurity region 103 are adjacent to each other at the bottom of the opening 502, so that they may be shorted by dielectric breakdown. Note that the thin film transistor 110 is one for selecting some of a plurality of memory devices, and is not limited to the structure shown as long as it has a switching function.

Embodiment Mode 6

In this embodiment mode, a method for manufacturing a semiconductor device including a thin film transistor, a memory element, and an antenna in accordance with the present invention will be described with reference to FIG. 6A to FIG. 10.

First, a release layer 702 is formed over a surface of a substrate 701 (FIG. 6A). The substrate 701 may be a glass substrate, a quartz substrate, a substrate in which an insulating film is formed over a surface of a metal substrate or a stainless-steel substrate, or a plastic substrate which can resist the treatment temperature of the manufacturing process. In the case of using such substrates, the area and the shape thereof are not particularly restricted; therefore, by using a rectangular substrate with at least one meter length on a side, for example, the productivity can be drastically improved. This merit is greatly advantageous as compared to the case of using a circular silicon substrate. In addition, the release layer 702 is formed over the entire surface of the substrate 701 in the process; however, the release layer 702 may be selectively provided by using photolithography after the release layer is formed over the entire surface of the substrate 701 as necessary. Further, the release layer 702 is formed so as to contact the substrate 701; however, an insulating film may be formed as a base film to contact the substrate 701 as necessary and the release layer 702 may be formed to contact the insulating film.

The release layer 702 is formed in a single layer or a layered structure with a film using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si), an alloy material or a compound material containing the above described element as its main component by sputtering, plasma CVD, or the like. The film containing silicon may have any structure of an amorphous, microcrystalline, or polycrystalline structure.

In the case where the release layer 702 has a single layer structure, a tungsten film, a molybdenum film, or a film containing a mixture of tungsten and molybdenum may be formed, for example. Alternatively, a film containing oxide or oxynitride of tungsten, a film containing oxide or oxynitride of molybdenum, or a film containing oxide or oxynitride of a mixture of tungsten and molybdenum may be formed. Further, a mixture of tungsten and molybdenum is, for example, an alloy of tungsten and molybdenum. Further, oxide of tungsten may be referred to as tungsten oxide.

In the case where the release layer 702 has a layered structure, a tungsten film, a molybdenum film, or a film containing a mixture of tungsten and molybdenum may be formed as a first layer. A film containing oxide, nitride, oxynitride, or nitride oxide of tungsten, a film containing oxide, nitride, oxynitride, or nitride oxide of molybdenum, or a film containing oxide, nitride, oxynitride, or nitride oxide of a mixture of tungsten and molybdenum may be formed as a second layer.

When a stack of a film containing tungsten and a film containing oxide of tungsten is formed as the release layer 702, a film containing tungsten is formed and a film containing silicon oxide may be formed thereon so that oxide of tungsten is formed at the interface between the tungsten film and the silicon oxide film. This also applies to the case of forming a film containing nitride, oxynitride, or nitride oxide of tungsten. In this case, after a film containing tungsten is formed, a silicon nitride film, a silicon oxynitride film, or a silicon nitride oxide film may be formed thereon. Tungsten oxide is referred to as $WO_X$ and X is in the range of 2 to 3; there are $WO_2$ in the case where X is 2, $W_2O_5$ in the case where X is 2.5, $W_4O_{11}$ in the case where X is 2.75, $WO_3$ in the case where X is 3, and the like. When forming an oxide of tungsten, the above value of X is not limited in particular, and composition can be determined based on an etching rate or the like. The film containing tungsten oxide ($WO_X$, $0<X<3$) which is formed by sputtering in an oxygen atmosphere is preferable to obtain the most preferable etching rate. Accordingly, in order to reduce time of manufacture, a film containing tungsten oxide which is formed by sputtering in an oxygen atmosphere is preferably formed as the release layer.

Next, an insulating film 703 to be a base is formed to cover the release layer 702. The insulating film 703 is formed with a single layer or a laminate of a film containing oxide of silicon or nitride of silicon by sputtering, plasma CVD, or the like. Oxide of silicon is a material containing silicon (Si) and oxygen (O), such as silicon oxide, silicon oxynitride, or silicon nitride oxide. Nitride of silicon is a material containing silicon and nitrogen (N), such as silicon nitride, silicon oxynitride, or silicon nitride oxide. In the case where the insulating film to be a base has a two-layer structure, a silicon nitride oxide film may be formed as a first layer, and a silicon oxynitride film may be formed as a second film, for example. In the case where the insulating film to be a base has a three-layer structure, a silicon oxide film, a silicon nitride oxide film, and a silicon oxynitride film may be formed as a first-layer insulating film, a second-layer insulating film, and a third-layer insulating film respectively. Alternatively, a silicon oxynitride film, a silicon nitride oxide film, and a silicon oxynitride film may be formed as a first-layer insulating film, a second-layer insulating film, and a third-layer insulating film respectively. The insulating film to be a base functions as a blocking film for preventing impurities from entering from the substrate 701.

Subsequently, an amorphous semiconductor film 704 (for example, a film containing amorphous silicon) is formed over the insulating film 703. The amorphous semiconductor film 704 is formed to a thickness of 25 nm to 200 nm (preferably 30 nm to 150 nm) by sputtering, LPCVD, plasma CVD, or the like. The amorphous semiconductor film 704 is crystallized by a laser crystallization method, a thermal crystallization method using RTA or thermal annealing using an annealing furnace, a thermal crystallization method using a metal element for promoting crystallization, a method in which the laser crystallization method is combined with the thermal crystallization method using a metal element for promoting crystallization, or the like to form a crystalline semiconductor film. The obtained crystalline semiconductor film is then processed into a desired shape, thereby crystalline semiconductor films 706 to 710 are formed (FIG. 6B).

An example of formation steps of the crystalline semiconductor films 706 to 710 will be described briefly as follows. First, an amorphous semiconductor film is formed to a thickness of 66 nm by plasma CVD. Next, after a solution containing nickel that is a metal element which promotes crystallization is applied onto the amorphous semiconductor film, dehydrogenation treatment (at 500° C., for 1 hour) and thermal crystallization treatment (at 550° C., for 4 hours) are performed on the amorphous semiconductor film, thereby the crystalline semiconductor films are formed. After that, the crystalline semiconductor film is irradiated with laser light as needed, and photolithography and etching treatment are performed to form the crystalline semiconductor films 706 to 710. In the case where the laser crystallization method is employed for forming the crystalline semiconductor film, a continuous wave or pulsed gas laser or solid-state laser may be used. As the gas laser, an excimer laser, a YAG laser, a $YVO_4$ laser, a YLF laser, a $YAlO_3$ laser, a glass laser, a ruby laser, a Ti: sapphire laser, or the like may be used. As the solid-state laser, a laser using a crystal such as YAC, $YVO_4$, YLF, and $YAlO_3$ doped with Cr, Nd, Er, Ho, Ce, Co, Ti, or Tm may be used.

In addition, the crystallization of the amorphous semiconductor film using a metal element for promoting crystallization is advantageous because the crystallization can be performed at low temperature in short time and the direction of crystals becomes uniform. On the other hand, there is also a disadvantage that the characteristics are not stable because the off-state current is increased due to the metal element remaining in the crystalline semiconductor film. Accordingly, it is preferable to form an amorphous semiconductor film functioning as a gettering site over the crystalline semiconductor film. The amorphous semiconductor film to be a gettering site is required to contain an impurity element such as phosphorous or argon; accordingly, it is preferably formed by sputtering by which argon can be contained at high concentration. Subsequently, heat treatment (RTA, thermal annealing using an annealing furnace, or the like) is performed to diffuse the metal element into the amorphous semiconductor film, and the amorphous semiconductor film containing the metal element is removed therefrom. In this manner, the content of the metal element in the crystalline semiconductor film can be reduced or eliminated.

Then, a gate insulating film 705 is formed to cover the crystalline semiconductor films 706 to 710. The gate insulating film 705 is formed with a single layer or a laminate of a film containing oxide of silicon or nitride of silicon by plasma CVD, sputtering, radical oxidation, or thermal oxidation. Specifically, a film containing silicon oxide, a film containing silicon oxynitride, or a film containing silicon nitride oxide is formed in a single layer or layered structure.

Subsequently, a first conductive film and a second conductive film are stacked on the gate insulating film 705. The first conductive film is formed to a thickness of 20 nm to 100 nm by plasma CVD or sputtering. The second conductive film is formed to a thickness of 100 nm to 400 nm. The first conductive film and the second conductive film are formed using an element selected from tantalum (Ta), tungsten (W), titanium (Ti), molybdenum (Mo), aluminum (Al), copper (Cu), chromium (Cr), niobium (Nb), or the like, an alloy material or a compound material containing the above-described element as its main component.

Alternatively, a semiconductor material, typically polycrystalline silicon doped with an impurity element such as phosphorus, may be used. As a combination of the first conductive film and the second conductive film, a tantalum nitride (TaN) film and a tungsten (W) film, a tungsten nitride (WN) film and a tungsten film, a molybdenum nitride (MoN) film and a molybdenum (Mo) film, or the like can be used for example. Since tungsten, tantalum nitride, or the like has high heat resistance, heat treatment for thermal activation can be performed after the first conductive film and the second conductive film are formed. Alternatively, in the case of employing a three-layer structure instead of a two-layer structure, a layered structure of a molybdenum film, an aluminum film, and a molybdenum film may be used.

Then, a mask is formed of resist by photolithography and a gate electrode and a gate line are etched, thereby conductive films (also referred to as gate electrode films) 716 to 725 functioning as gate electrodes are formed.

Next, another mask is formed of resist by photolithography. Then, an impurity element imparting N-type conductivity is added to the crystalline semiconductor films 706, and 708 to 710 at low concentration by ion doping or ion implantation to form N-type impurity regions 711, and 713 to 715 and channel formation regions 780, and 782 to 784. An element belonging to group 15 of the periodic table may be used for the impurity element imparting N-type conductivity. For example, phosphorus (P) or arsenic (As) is used.

Next, still another mask is formed of resist by photolithography. Then, an impurity element imparting p-type conductivity is added into the crystalline semiconductor film 707 to form a p-type impurity region 712 and a channel formation region 781. For example, boron (B) is used for the impurity element imparting p-type conductivity.

Next, an insulating film is formed so as to cover the gate insulating film 705 and the conductive films 716 to 725. The insulating film is formed with a single layer or a stack of a film containing an inorganic material such as silicon, oxide of silicon, or nitride of silicon, or a film containing an organic material such as an organic resin by plasma CVD, sputtering, or radical oxidation; or a combination thereof. Then, the insulating film is selectively etched by anisotropic etching mainly in the perpendicular direction, thereby insulators (also referred to as sidewalls) 739 to 743 in contact with the side faces of the conductive films 716 to 725 are formed (see FIG. 6C). Concurrently with the formation of the insulators 739 to 743, insulating films 734 to 738 are formed by etching the gate insulating film 705. The insulators 739 to 743 are used as masks for doping in the subsequent formation of an LDD (Lightly Doped Drain) region.

Then, using the mask formed of a resist by photolithography and the insulators 739 to 743 as masks, an impurity element imparting N-type conductivity is added to the crystalline semiconductor films 706, and 708 to 710 so that first N-type impurity regions (also referred to as LDD regions) 727, 729, 731, and 733 and second N-type impurity regions 726, 728, 730, and 732 are formed. The concentration of the impurity element in the first N-type impurity regions 727, 729, 731, and 733 is lower than the concentration of the impurity element in the second N-type impurity regions 726, 728, 730, and 732. Through the above-described steps, N-type thin film transistors 744, and 746 to 748 and a p-type thin film transistor 745 are completed.

It is to be noted that there are the following two methods for forming the LDD region, for example. One is a method in which a gate electrode is formed in a layered structure having two or more layers, and taper etching or anisotropic etching is performed on the gate electrode so that a conductive film of a lower layer in the gate electrode is used as a mask. The other is a method in which an insulator of a sidewall is used as a mask. A thin film transistor that is formed by the former method has a structure in which an LDD region is overlapped with a gate electrode with a gate insulating film interposed therebetween. In this structure, since the gate electrode is etched into a tapered shape or etched by anisotropically etching is used, it is difficult to control the width of the LDD region, and the LDD region may not be formed if the etching step is not performed appropriately. On the other hand, the latter method which uses an insulator of a sidewall as a mask is used, as compared with the former method, the width of the LDD region can easily be controlled, and the LDD region can be formed without fail.

The thin film transistor is not limited to the structure shown in this embodiment mode. The thin film transistor may have a structure in which an LDD region is not provided or sidewalls are not provided. Alternatively, the thin film transistor may have a single-gate structure in which one channel formation region is formed, a double-gate structure in which two channel formation regions are formed, or a triple-gate structure in which three channel formation regions are formed. Accordingly, a thin film transistor may have a multigate structure in which a plurality of channel regions are provided. In addition, the thin film transistor in a peripheral driver circuit area may also have a single-gate structure or a multigate structure such as a double-gate structure or a triple-gate structure. Further, without limitation to the structures of a thin film transistor shown in this embodiment mode, the present invention can be applied to a thin film transistor having another structure such as a top gate type (a planar type), a bottom gate type (an inverted staggered type), a dual-gate type having two gate electrodes over and below a channel region with insulating films therebetween.

Then, an insulating film is formed in a single layer or a layered structure so as to cover the thin film transistors 744 to 748 (FIG. 7A). The insulating film covering the thin film transistors 744 to 748 is formed with a single layer or a laminate using an inorganic material such as oxide of silicon or nitride of silicon; an organic material such as polyimide, polyamide, benzocyclobutene, acrylic, epoxy resin, or siloxane; or the like by an SOG method, a droplet discharge method, or the like. Alternatively, an oxazole resin can be used; for example, a photosensitive polybenzoxazole or the like can be used. The photosensitive polybenzoxazole has a low dielectric constant (a dielectric constant of 2.9 at 1 MHz at room temperature), high heat resistance (thermal decomposition temperature of 550° C. with the rise in temperature of 5° C./min, which is measured by thermogravimetric analyzer (TGA)), and a low water absorption rate (0.3% at room temperature in 24 hours). Since an oxazole resin has a lower dielectric constant as compared to polyimide, it is more suitable as an interlayer insulating film. For example, an insulating film 749 having a film containing silicon oxide and a film containing silicon nitride, and an insulating film 750 having a film containing silicon oxide may preferably be formed as insulating films covering the thin film transistors 744 to 748.

It is to be noted that before the insulating films 749 and 750 are formed or after one or more of thin films of the films forming the insulating films 749 and 750 are formed, heat treatment for recovering the crystallinity of the semiconductor film, for activating the impurity element which has been added to the semiconductor film, or for hydrogenating the semiconductor film is preferably performed. For the heat treatment, thermal annealing, laser annealing, RTA, or the like is preferably used.

Then, the insulating films 749 and 750 are etched by photolithography to form contact holes so that the N-type impurity regions 726, 728, 730, and 732 and the p-type impurity region 712 are exposed. Subsequently, a conductive film is formed on the contact holes and patterned to form conductive films 752 to 761 each functioning as a source or drain wiring.

The conductive films 752 to 761 are formed with a single layer or a laminate using an element selected from titanium (Ti), aluminum (Al), or neodymium (Nd); an alloy material or a compound material containing the above-described element as its main component by plasma CVD or sputtering. An alloy material whose main component is aluminum, which contains aluminum as its main component is an alloy material containing nickel or an alloy material whose main component is aluminum, which contains nickel and one or both of carbon and silicon, for example. Each of the conductive films 752 to 761 preferably has, for example, a layered structure of a barrier film, an aluminum-silicon (Al—Si) film, and a barrier film, or a layered structure of a barrier film, an aluminum-silicon (Al—Si) film, a titanium nitride (TiN) film, and a barrier film.

It is to be noted that the barrier film corresponds to a thin layer formed using titanium, nitride of titanium, molybdenum, or nitride of molybdenum. Aluminum and aluminum silicon have low resistance and are inexpensive, so that they are suitable for forming the conductive films 752 to 761. In addition, generation of a hillock of aluminum or aluminum silicon can be prevented when barrier films are provided as an upper layer and a lower layer of the conductive films 752 to 761. Further, when the barrier film is formed by using titanium that is an easily reducible element, even if a thin natural oxide layer is formed on the crystalline semiconductor film, the natural oxide film is reduced so that preferable contact with the crystalline semiconductor film can be obtained.

Next, an insulating film 762 is formed to have a single layer structure or a layered structure so as to cover the conductive films 752 to 761 (FIG. 7B). The insulating film 762 is formed with a single layer or a laminate using an inorganic material or an organic material by an SOG method, a droplet discharge method, or the like. The insulating film 762 is preferably formed to a thickness of 0.75 μm to 3 μm.

Subsequently, the insulating film 762 is etched by photolithography to form openings 795 to 757. At this time, the openings 795 and 796 are formed to make the insulating film 762 has a thinner part so as not to expose the conductive films 755 and 757. In other words, the openings 795 and 796 are formed so that the insulating film 762 remains under the openings between the conductive film 763 to be formed in a later step and the conductive films 755 and 757. Further, the opening 797 is formed so as to expose the conductive film 761 as shown in FIG. 7B. The openings 795 to 797 having different depths can be formed by methods shown described in Embodiment Modes 1 to 4.

Then, a conductive film is formed on the openings 795 to 797 (FIG. 7C). The conductive film is formed by plasma CVD or sputtering using a conductive material. The conductive film is patterned to form conductive films 763 and 765. It is to be noted that each of the conductive films 763 and 765 corresponds to one of a pair of conductive films included in a memory element. Therefore, the conductive films 763 and 765 are preferably formed with a single layer or a laminate using titanium, an alloy material or a compound material containing titanium as its main component.

Wet etching may preferably be performed so as not to damage the thin film transistors 744 to 748 when forming the conductive films 763 and 765 by photolithography.

Through the above steps, a memory element portion 767 formed from a laminate of the conductive film 763, the insulating film 762, and the conductive film 755 and a memory element portion 768 formed from a laminate of the conductive film 763, the insulating film 762, and the conductive film 757 are completed. In other words, the memory element portion 767 is formed from the insulating film 762, and the conductive film 763 and the conductive film 755 which overlap with each other with the insulating film 762 therebetween. Further, the memory element portion 768 is formed form the insulating film 762, and the conductive film 763 and the conductive film 757 with the insulating film 762 therebetween.

Subsequently, a conductive film 786 functioning as an antenna which is in contact with the conductive film 765 is formed (FIG. 8A). The conductive film 786 is formed by plasma CVD, sputtering, printing, or a droplet discharge method using a conductive material. Preferably, the conductive film 786 is formed with a single layer or a laminate using an element selected from aluminum (Al), silver (Ag), copper (Cu), titanium (Ti), or an alloy material or a compound material containing the above-described element as its main component. Specifically, the conductive film 786 is formed by screen printing using a paste containing silver followed by heat treatment at 50° C. to 350° C. Alternatively, an aluminum film is formed by sputtering, and is patterned to form the conductive film 786. The aluminum film is preferably patterned by wet etching, and heat treatment at 200° C. to 300° C. is preferably conducted after the wet etching.

Subsequently, an insulating film 772 functioning as a protective film is formed by an SOG method, a droplet discharge method, or the like so as to cover the memory element portions 767 and 768 and the conductive film 786 functioning as an antenna. The insulating film 772 is formed from a film containing carbon such as DLC (Diamond Like Carbon), a film containing silicon nitride, a film containing silicon nitride oxide, or an organic material, or preferably formed of an epoxy resin.

The insulating films 703, 749, 750, 762, and 772 are then etched by photolithography to form openings 773 and 774 so that the release layer 702 is exposed (FIG. 9A). The openings 773 and 774 may be formed by burning the insulating films away with a laser or the like to expose the release layer 702.

Subsequently, the release layer 702 is removed by introducing an etchant into the openings 773 and 774 (FIG. 9B). As the etchant, a gas or a liquid containing halogen fluoride or an interhalogen compound is used; for example, chlorine trifluoride ($ClF_3$) is used as a gas containing halogen fluoride.

Thus, a thin film integrated circuit 791 is separated from the substrate 701. Incidentally, the thin film integrated circuit 791 includes an element group of the thin film transistors 744 to 748 and the memory element portions 767 and 768, and the conductive film 786 functioning as an antenna. The release layer 702 may be partially left without being removed entirely. This can reduce the process time.

It is preferable to reuse the substrate 701 after the thin film integrated circuit 791 is separated, thereby reducing the cost. In addition, the insulating film 772 is formed to prevent the thin film integrated circuit 791 from scattering after the release layer 702 is removed. The thin film integrated circuit 791 is small, thin, and light; therefore, it easily scatters after the release layer 702 is removed because it is not attached firmly to the substrate 701. However, by forming the insulating film 772 on the thin film integrated circuit 791, the thin film integrated circuit 791 is weighed and scattering from the substrate 701 can be prevented. In addition, by forming the insulating film 772, the thin film integrated circuit 791 which is thin and light alone is not rolled and some strength can be ensured.

Figure 10:
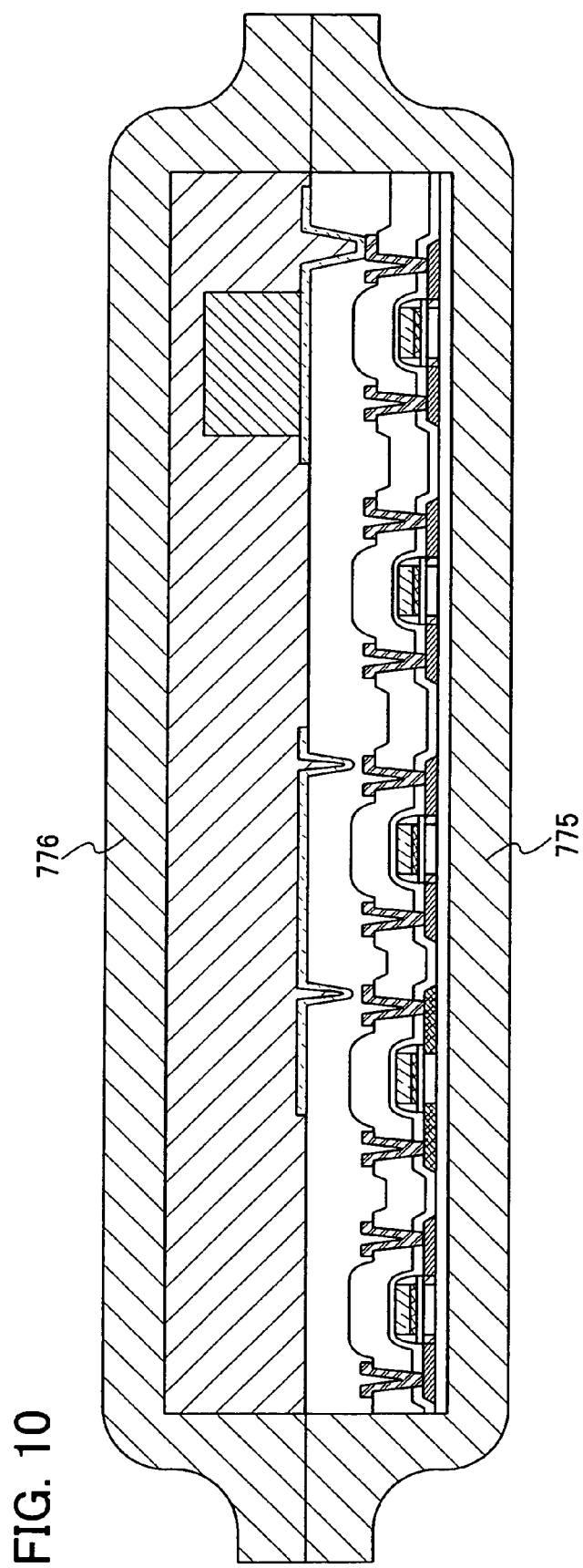
FIG. 10 is a figure showing a step for manufacturing a semiconductor device of the invention.

Subsequently, one surface of the thin film integrated circuit 791 is attached to a first support 776, and the thin film integrated circuit 791 is completely separated from the substrate 701 (FIG. 10). Then, the other surface of the thin film integrated circuit 791 is attached to a second support 775, and then, one or both of heat treatment and pressure treatment are performed to seal the thin film integrated circuit 791 with the first support 776 and the second support 775. Each of the first support 776 and the second support 775 is a film formed of polypropylene, polyester, vinyl, polyvinyl fluoride, polyvinyl chloride, or the like, paper of a fibrous material, a film stack of a base film (polyester, polyamide, an inorganic vapor deposition film, papers, or the like) and an adhesive synthetic resin film (an acrylic-based synthetic resin, an epoxy-based synthetic resin, or the like), or the like.

The films are subjected to heat treatment and pressure treatment by thermocompression bonding. An adhesive layer which is provided on the outermost surface of the adhesive layer or the outer layer (not an adhesive layer) which is provided on the outermost layer thereof is melted by heart treatment, and then is pressured, so that the films are attached. An adhesive layer may be, but not necessarily, provided on a surface of the first support 776 or the second support 775. The adhesive layer is a layer containing an adhesive such as a thermosetting resin, an ultraviolet-curable resin, an epoxy resin-based adhesive, or a resin additive.

Through the above steps, a semiconductor device having a memory element portion and an antenna can be manufactured. A semiconductor device of this embodiment mode is capable of transmitting/receiving without contact. Further, through the above steps, a flexible semiconductor device can be obtained.

Embodiment Mode 7

Next, application examples of a semiconductor device having a memory element portion shown in Embodiment Mode 6 and an antenna will be described with reference to drawings. The semiconductor device which can transmit and receive data without contact is generally referred to as an RFID (Radio Frequency Identification) tag, an ID tag, an IC tag, an IC chip, an RF (Radio Frequency) tag, a wireless tag, an electronic tag, or a wireless chip in accordance with a usage pattern.

Figure 11A:
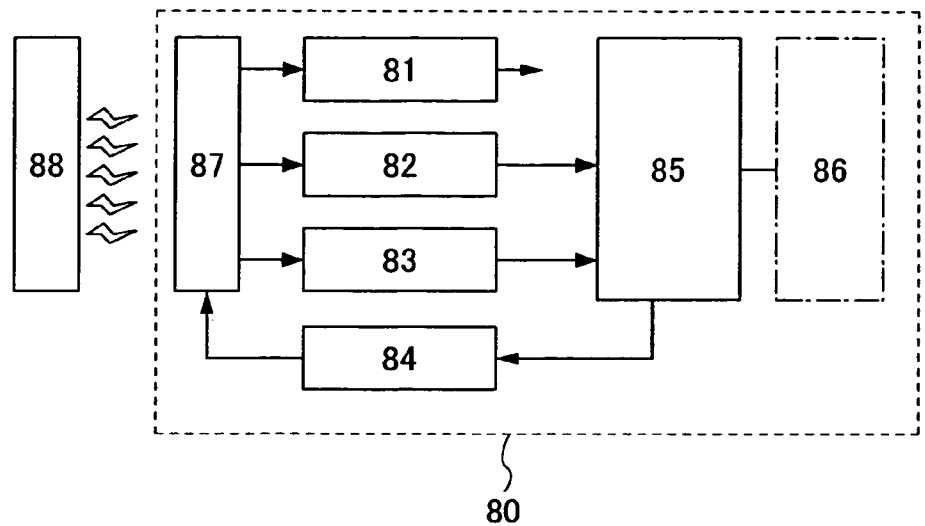
FIGS. 11A to 11C are figures showing usage patterns of a semiconductor device of the invention.

An RFID tag 80 has a function of transmitting and receiving data without contact, and includes a power supply circuit 81, a clock generation circuit 82, a data demodulation circuit 83, a data modulation circuit 84, a control circuit 85 for controlling other circuits, a memory circuit 86, and an antenna 87 (FIG. 11A). Further, the RFID tag may include a plurality of memory circuits rather than one memory circuit. In the case of providing a plurality of memory circuits, an SRAM, a flash memory, a ROM, a FeRAM, or the like can also be used in addition to a memory circuit having a memory device described in the above described embodiment modes in a memory element portion.

Signals sent from a reader/writer 88 as radio waves are converted into alternating-current electric signals by electromagnetic induction in the antenna 87. Power supply voltage is generated in the power supply circuit 81 by using the alternating-current electric signals, and supplied to each circuit using a power supply line. The clock generation circuit 82 generates various kinds of clock signals based on the alternating-current electric signals, which are inputted from the antenna 87, and supplies the various kinds of clock signals to the control circuit 85. The demodulation circuit 83 demodulates the alternating-current electric signals and supplies the demodulated alternating-current electric signals to the control circuit 85. In the control circuit 85, various kinds of arithmetic processings are performed in accordance with the inputted signals. Programs, data, and the like that are used in the control circuit 85 are stored in the memory circuit 86. In addition, the memory circuit 86 can also be used as a work area in the arithmetic processings. Then, data is transmitted from the control circuit 85 to the modulation circuit 84, and load modulation can be applied to the antenna 87 from the modulation circuit 84 in accordance with the data. Consequently, the reader/writer 88 receives load modulation applied to the antenna 87 via radio waves so that the reader/writer can read the data.

In addition, the RFID tag may be of a type in that power supply voltage is supplied to each circuit via radio waves without using a power source (a battery), or another type in that power supply voltage is supplied to each circuit by utilizing both radio waves and a power source (a battery) mounted.

With the structure described in the above embodiment modes, a foldable RFID tag can be manufactured. Thus, such an RFID tag can be attached to an object having a curved surface.

Figure 11B:
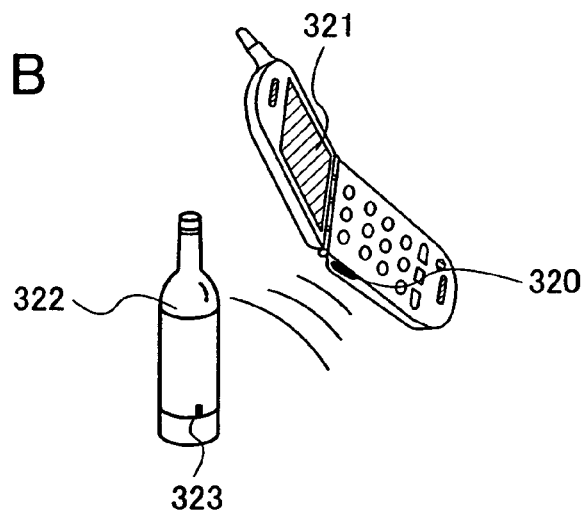
Figure 11C:
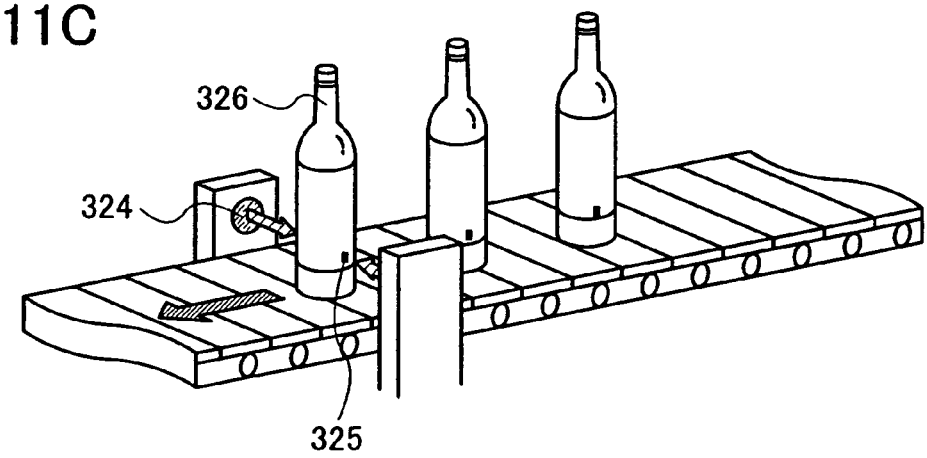
Figure 12A:
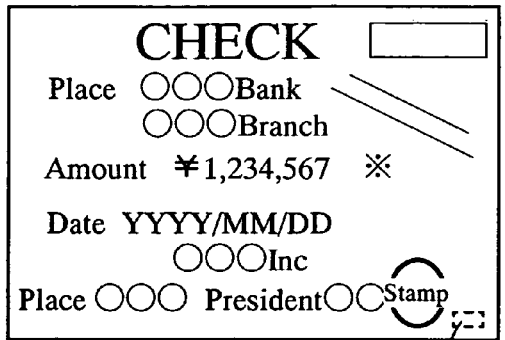
FIGS. 12A to 12H are figures showing usage patterns of a semiconductor device of the invention.
Figure 12B:
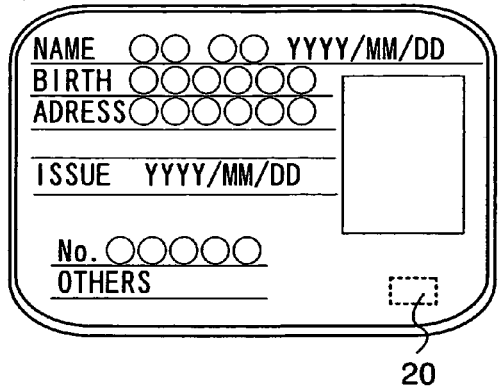
Figure 12C:
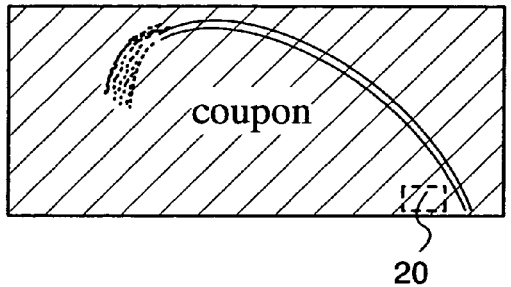
Figure 12D:
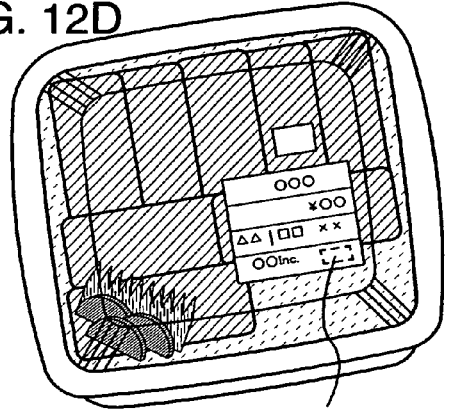
Figure 12E:
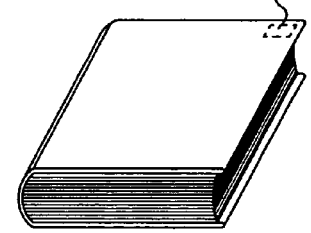
Figure 12F:
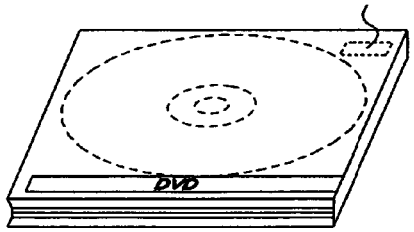
Figure 12G:
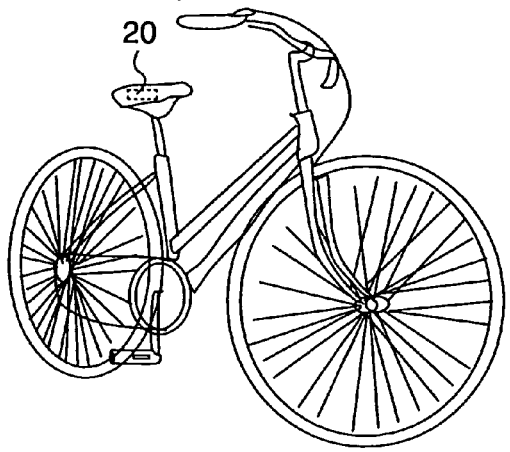
Figure 12H:
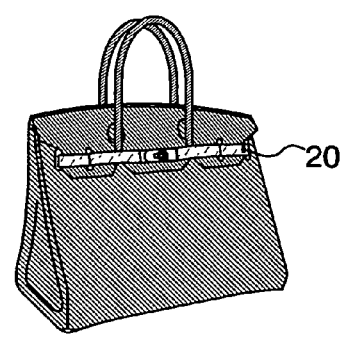

Next, an example of a usage pattern of a flexible RFID tag will be described. A reader/writer 320 is provided on a side surface of a portable terminal which includes a display area 321. An RFID tag 323 is provided on a side surface of an article 322 (FIG. 11B). When the reader/writer 320 is held to the RFID tag 323 included in the article 322, information about the product such as the raw material, the place of origin, the test results in each production process, the history of distribution process, and the description of a commodity, is displayed on the display area 321. In addition, when a product 326 is conveyed by a belt conveyor, the inspection of the product 326 can be carried out using a reader/writer 324 and an RFID tag 325 provided on the product 326 (FIG. 11C). In this manner, by utilizing an RFID tag in a system, information can be easily obtained, thereby realizing high performance and high added value. As described in the above embodiment modes, even when an RFID tag is attached to an object having a curved surface, a thin film transistor, or the like included in the RFID tag can be prevented from being damaged, so that a highly reliable RFID tag can be provided.

Other than those described above, the application range of flexible RFID tags is so wide that it may be applied to any product in order that the information of the object such as the history is revealed without contact and utilized in production, management, and the like. For example, such an RFID tag may be incorporated in bills, coins, securities, certificates, bearer bonds, containers for packaging, books, recording media, personal belongings, vehicles, foods, clothes, healthcare items, consumer products, medicals, and electronic devices. Examples of these products are described with reference to FIGS. 12A to 12H.

The bills and coins include currency in the market and include notes that are current as money in a specific area (cash voucher), memorial coins, and the like. The securities include a check, a certificate, a promissory note, and the like (see FIG. 12A). The certificates include a driver's license, a resident card, and the like (see FIG. 12B). The bearer bonds include a stamp, a rice coupon, various gift coupons, and the like (see FIG. 12C). The containers for packaging include paper for wrapping a box lunch or the like, a plastic bottle, and the like (see FIG. 12D). The books include a document and the like (see FIG. 12E). The recording media include DVD software, a video tape, and the like (see FIG. 12F). The vehicles include a wheeled vehicle such as a bicycle, a vessel, and the like (see FIG. 12G). The personal belongings include a bag, glasses, and the like (see FIG. 12H). The foods include food items, beverages, and the like. The clothes include clothing, footwear, and the like. The healthcare items include a medical device, a health appliance, and the like. The consumer products include furniture, a lighting apparatus, and the like. The medicals include a medicine, an agricultural chemical, and the like. The electronic devices include a liquid crystal display device, an EL display device, a television set (television receiver, thin television receiver), a cellular phone, and the like.

When an RFID tag 20 is incorporated in bills, coins, securities, certificates, bearer bonds, and the like, forgery of them can be prevented. When an RFID tag 20 is incorporated in containers for packaging, books, recording media, personal belongings, foods, consumer products, electronic devices, and the like, the efficiency of an inspection system, a system used in a rental shop, or the like can be improved. When an RFID tag 20 is incorporated in vehicles, healthcare items, medicals, and the like, forgery and theft of them can be prevented and medicines can be prevented from being consumed in a wrong manner. An RFID tag 20 may be attached to the surface of a product or incorporated into a product. For example, an RFID tag 20 may be incorporated into paper of a book, or an organic resin of a package. By using a flexible RFID tag 20 having such a structure described in the above embodiment modes, damage or the like to an element included in the RFID tag 20 can be prevented even when the RFID tag 20 is mounted on paper or the like.

Thus, when an RFID tag is incorporated in containers for packaging, recording media, personal belongings, foods, clothes, consumer products, electronic devices, and the like, efficiency of an inspection system, a rental system, and the like can be increased. An RFID tag also prevents vehicles from being forged or stolen. In addition, when an RFID tag is implanted into creatures such as animals, each creature can be identified easily. For example, when an RFID tag provided with a sensor is implanted into creatures such as domestic animals, not only the year of birth, sex, breed, and the like but also the health condition such as the current body temperature can be easily managed.

Embodiment 1

In this embodiment, a manufacturing result of a memory element shown in Embodiment Mode 1 will be described with reference to FIGS. 13A to 14B.

Figure 13A:
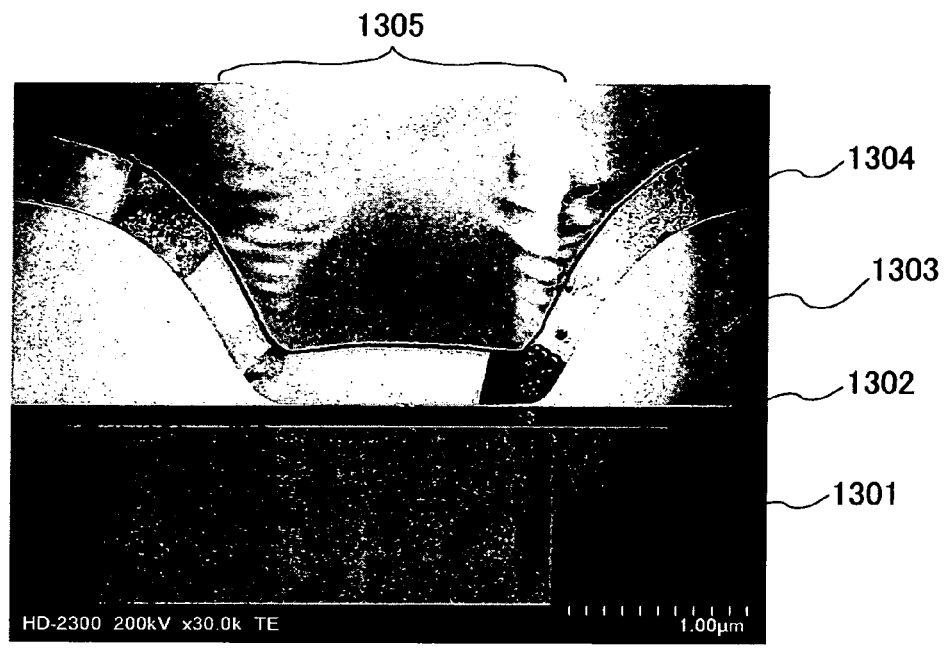
FIGS. 13A and 13B are figures showing results of manufacturing a memory device of the invention.

First, an insulating film 1301 was formed, and a titanium film 1302 was formed to a thickness of 100 nm over the insulating film 1301. Next, a photosensitive polyimide film 1303 was formed to a thickness of 1.5 μm over the titanium film 1302 by spin coating. After the coating, an area corresponding to an opening 1305 was exposed using a photomask. Next, the polyimide film 1303 was etched to form the opening 1305 using TMAH (tetramethylammonium hydroxide) as a developing solution so as not to expose the titanium film 1302. After that, baking was carried out at 300° C. using an oven. Then, an aluminum film 1304 was formed to film thickness of 400 nm on the opening. Through the above steps, a memory element portion formed from the titanium film 1302, the polyimide film 1303, and the aluminum film 1304 was formed. FIG. 13A shows a scanning transmission electron microscope (STEM) image at a cross-section of the memory device portion. FIG. 13A shows that the polyimide film 1303 remains between the titanium film 1302 and the aluminum film 1304.

Figure 13B:
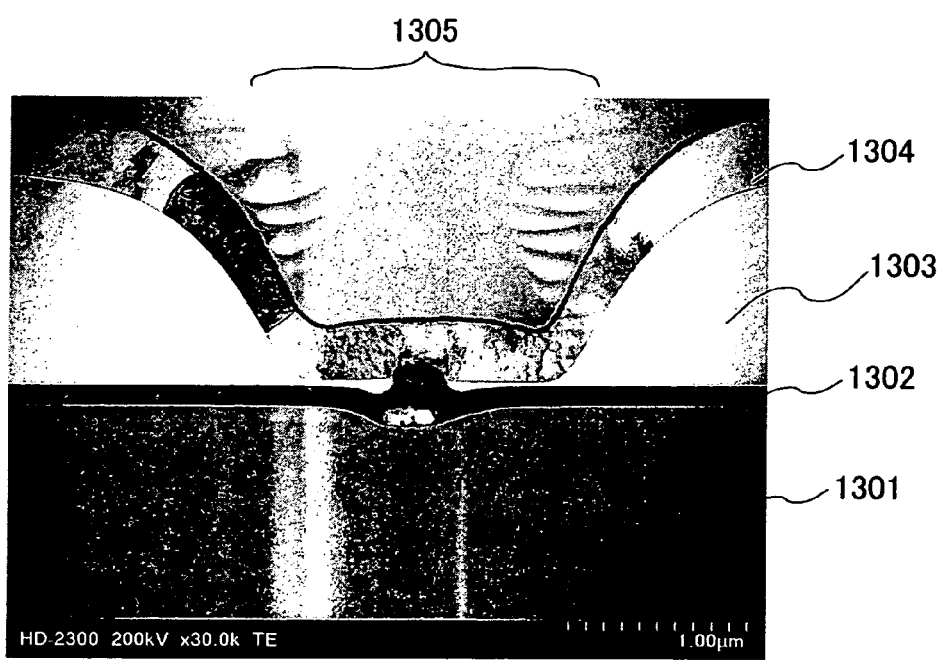

After that, a voltage of 6 V or more and 10 V or less was applied between the titanium film 1302 and the aluminum film 1304, thereby writing into the memory element portion. FIG. 13B shows a STEM image at a cross-section of the memory element portion after the application of the voltage. FIG. 13B shows that the titanium film 1302 and the aluminum film 1304 are adjacent to each other after the application of the voltage.

Figure 14A:
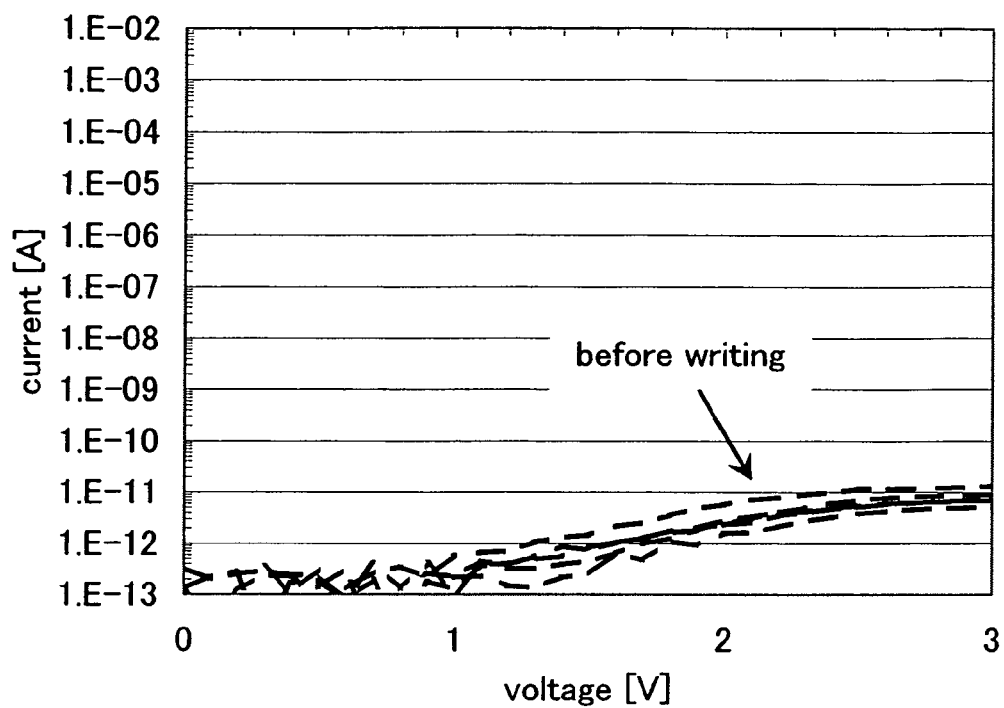
FIGS. 14A and 14B are figures showing results of manufacturing a memory device of the invention.
Figure 14B:
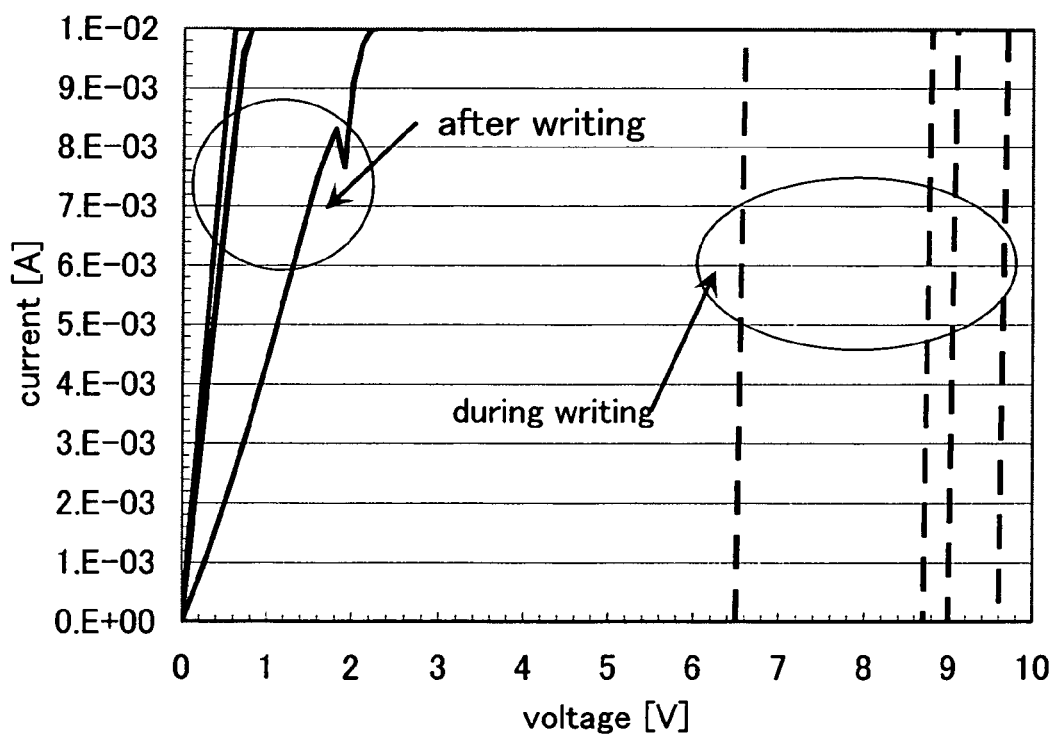

Further, FIGS. 14A and 14B show voltage-current properties of the memory element portion of the states before and after the writing into the memory element portion. In FIGS. 14A and 14B, a lateral axis indicates voltage applied between the titanium film 1302 and the aluminum film 1304, and a vertical axis indicates current flowing between the titanium film 1302 and the aluminum film 1304. Here, FIG. 14A illustrates voltage-current properties of the memory element portion of the state before writing into the memory element portion; meanwhile, FIG. 14B illustrates voltage-current properties of the memory element portion of the state after the writing into the memory element portion. Comparing FIG. 14A with FIG. 14B, it is found that current values at a time of application of the same voltage vary and the resistances change between before and after the writing. The change in resistance between before and after writing can be used for a memory device.

This application is based on Japanese Patent Application serial no. 2005-285561 filed in Japan Patent Office on Sep. 29, 2005, the entire contents of which are hereby incorporated by reference.

What is claimed is:

1. A memory device comprising:
 a first and second memory element portions each comprising:
  a first conductive film;
  an insulating film formed over the first conductive film, the insulating film having an opening; and
  a second conductive film formed over the insulating film and in the opening, wherein the insulating film exists between the first conductive film and the second conductive film formed in the opening, wherein a resistance value of the first and second memory element portions are different from each other, and wherein the first conductive film and the second conductive film in one of the first and second memory element portions are shorted.

2. The memory device according to claim 1, wherein the first conductive film is a source or drain wiring.

3. The memory device according to claim 1, wherein the first conductive film is a source or drain region.

4. The memory device according to claim 1, wherein the insulating film exists between the first conductive film and the second conductive film formed in a bottom of the opening.

5. The memory device according to claim 1, wherein the insulating film comprises an organic material.

6. The memory device according to claim 1, wherein the insulating film comprises a photosensitive material.

7. A memory device comprising:
a first and second memory element portions each comprising:
a first conductive film;
an insulating film formed over the first conductive film, the insulating film having an opening and a contact hole; and
a second conductive film formed over the insulating film, in the opening and in the contact hole,
wherein the insulating film exists between the first conductive film and the second conductive film formed in the opening,
wherein the first conductive film and the second conductive film are electrically connected in the contact hole, and
wherein a resistance value of the first and second memory element portions are different from each other.

8. The memory device according to claim 7, wherein the insulating film comprises an organic material.

9. The memory device according to claim 7, wherein the insulating film comprises a photosensitive material.

10. The memory device according to claim 7, wherein the first conductive film and the second conductive film in one of the first and second memory element portions are shorted in the opening.

11. A memory device comprising:
a first and second memory element portions each comprising:
a thin film transistor formed over a substrate;
a first insulating film formed over the thin film transistor;
a first conductive film formed over the first insulating film;
a second insulating film formed over the first conductive film, the second insulating film having an opening; and
a second conductive film formed over the second insulating film and in the opening,
wherein the second insulating film exists between the first conductive film and the second conductive film formed in the opening,
wherein a resistance value of the first and second memory element portions are different from each other, and
wherein the first conductive film and the second conductive film in one of the first and second memory element portions are shorted.

12. The memory device according to claim 3, wherein the second insulating film comprises an organic material.

13. The memory device according to claim 11, wherein the second insulating film comprises a photosensitive material.

14. A memory device comprising:
a first and second memory element portions each comprising:
a thin film transistor formed over a substrate;
a first insulating film formed over the thin film transistor;
a first conductive film formed over the first insulating film;
a second insulating film formed over the first conductive film, the second insulating film having an opening and a contact hole; and
a second conductive film formed over the second insulating film, in the opening and in the contact hole,
wherein the second insulating film exists between the first conductive film and the second conductive film formed in the opening,
wherein a resistance value of the first and second memory element portions are different from each other, and
wherein the first conductive film and the second conductive film are electrically connected in the contact hole.

15. The memory device according to claim 14, wherein the second insulating film comprises an organic material.

16. The memory device according to claim 14, wherein the second insulating film comprises a photosensitive material.

17. The memory device according to claim 14, wherein the first conductive film and the second conductive film in one of the first and second memory element portions are shorted in the opening.

18. A memory device comprising:
a base insulating film formed over a substrate;
a semiconductor film having at least a first impurity region and a second impurity region formed over the base insulating film;
a gate insulating film formed over the semiconductor film;
a gate electrode formed over the gate insulating film;
an insulating film formed over the gate electrode;
a first conductive film formed over the insulating film and an opening formed in the insulating film; and
a second conductive film formed over the insulating film and a contact hole formed in the insulating film,
wherein the insulating film exists between the first impurity region and the first conductive film formed in the opening, and
wherein the second impurity region and the second conductive film are electrically connected in the contact hole.

19. A memory device comprising:
a first and second memory element portions each comprising:
a first conductive film;
an insulating film formed over the first conductive film, the insulating film having an opening; and
a second conductive film formed over the insulating film and in the opening,
wherein the insulating film exists between the first conductive film and the second conductive film formed in the opening,
wherein the first conductive film and the second conductive film in one of the first and second memory element portions are shorted in the opening.

20. The memory device according to claim 19, wherein the insulating film comprises an organic material.

21. The memory device according to claim 19, wherein the insulating film comprises a photosensitive material.

* * * * *

UNITED STATES PATENT AND TRADEMARK OFFICE
CERTIFICATE OF CORRECTION

PATENT NO. : 7,745,827 B2
APPLICATION NO. : 11/525950
DATED : June 29, 2010
INVENTOR(S) : Yoshinobu Asami It is certified that error appears in the above-identified patent and that said Letters Patent is hereby corrected as shown below:

At column 10, line 46, "YAC" should be --YAG--;

At column 19, line 64, "3" should be --11--.

Signed and Sealed this

Ninth Day of November, 2010

David J. Kappos
*Director of the United States Patent and Trademark Office*